(12) United States Patent
Ahrens et al.

(10) Patent No.: US 7,405,917 B2
(45) Date of Patent: Jul. 29, 2008

(54) METHOD AND APPARATUS FOR MONITORING AND DETERMINING THE FUNCTIONAL STATUS OF AN ELECTROMAGNETIC VALVE

(75) Inventors: Oliver Ahrens, Bremen (DE); Otto Szenn, Leonberg (DE); Wjatscheslaw Missal, Bremen (DE); Karl-Heinz Forster, Dresden (DE)

(73) Assignee: Festo AG & Co., Esslingen (DE)

( * ) Notice: Subject to any disclaimer, the term of this patent is extended or adjusted under 35 U.S.C. 154(b) by 0 days.

(21) Appl. No.: 11/455,270

(22) Filed: Jun. 16, 2006

(65) Prior Publication Data

US 2007/0291438 A1    Dec. 20, 2007

(51) Int. Cl.
    *H01H 47/00* (2006.01)
(52) U.S. Cl. ............... 361/152; 324/418; 324/422; 324/423; 324/546
(58) Field of Classification Search ........... 361/152; 324/546, 418, 422, 423
    See application file for complete search history.

(56) References Cited

U.S. PATENT DOCUMENTS

| 2,828,068 | A |   | 3/1958 | Sperry |
|---|---|---|---|---|
| 4,734,869 | A |   | 3/1988 | Mickowski |
| 4,856,278 | A |   | 8/1989 | Widmann et al. |
| 4,862,385 | A |   | 8/1989 | Fujita et al. |
| 4,873,606 | A | * | 10/1989 | Pannier ................. 361/152 |
| 4,976,144 | A |   | 12/1990 | Fitzgerald |
| 4,985,857 | A |   | 1/1991 | Bajpai et al. |
| 5,067,099 | A |   | 11/1991 | McCown et al. |
| 5,081,599 | A |   | 1/1992 | Saito |
| 5,153,522 | A | * | 10/1992 | Sano ....................... 324/546 |
| 5,197,439 | A | * | 3/1993 | Gronenberg et al. ........ 123/506 |
| 5,218,968 | A |   | 6/1993 | Apple et al. |
| RE34,559 | E |   | 3/1994 | Mickowski |
| 5,329,465 | A |   | 7/1994 | Arcella et al. |
| 5,343,737 | A |   | 9/1994 | Baumoel |
| 5,453,944 | A |   | 9/1995 | Baumoel |
| 5,471,400 | A |   | 11/1995 | Smalley et al. |
| 5,477,149 | A | * | 12/1995 | Spencer et al. ............. 324/418 |
| 5,493,512 | A |   | 2/1996 | Peube et al. |
| 5,550,498 | A |   | 8/1996 | Kwan et al. |
| 5,594,663 | A |   | 1/1997 | Messaros et al. |
| 5,608,845 | A |   | 3/1997 | Ohtsuka et al. |
| 5,628,229 | A |   | 5/1997 | Krone et al. |
| 5,642,278 | A |   | 6/1997 | Wang et al. |
| 5,801,964 | A |   | 9/1998 | McCarthy |
| 5,893,047 | A |   | 4/1999 | Gimblett et al. |
| 6,131,609 | A |   | 10/2000 | Metso et al. |

(Continued)

FOREIGN PATENT DOCUMENTS

DE    100 52 664 A1    5/2002

(Continued)

*Primary Examiner*—Michael J Sherry
*Assistant Examiner*—Tien Mai
(74) *Attorney, Agent, or Firm*—Hoffmann & Baron, LLP

(57) ABSTRACT

The present invention provides a method and apparatus for determining the functional status of an electromagnetic valve having a solenoid and plunger including determining the electro-mechanical switching time of a valve based on characteristics of an electrical characteristic responsive to the solenoid; comparing the valve electro-mechanical switching time to a predetermined value; and generating a valve status signal dependant on the results of the comparison.

24 Claims, 23 Drawing Sheets

U.S. PATENT DOCUMENTS

| | | |
|---|---|---|
| 6,246,972 B1 | 6/2001 | Klimasauskas |
| 6,282,463 B1 | 8/2001 | Oneyama et al. |
| 6,292,757 B1 | 9/2001 | Flanagan et al. |
| 6,308,138 B1 | 10/2001 | Jones et al. |
| 6,405,108 B1 | 6/2002 | Patel et al. |
| 6,425,247 B1 | 7/2002 | Schmid |
| 6,542,853 B1 | 4/2003 | Murakami et al. |
| 6,678,584 B2 | 1/2004 | Junk et al. |
| 6,711,507 B2 | 3/2004 | Koshinaka et al. |
| 6,847,854 B2 | 1/2005 | Discenzo |
| 6,874,480 B1 | 4/2005 | Ismailov |
| 7,031,850 B2 | 4/2006 | Kambli et al. |
| 2003/0125841 A1 | 7/2003 | Schlosser |
| 2005/0043923 A1 | 2/2005 | Forster et al. |

FOREIGN PATENT DOCUMENTS

| | | |
|---|---|---|
| EP | 0534 506 A2 | 3/1993 |
| EP | 0 587 902 A1 | 3/1994 |
| EP | 0 850 363 B1 | 7/1998 |
| WO | WO 95/19589 | 7/1995 |
| WO | WO98/02664 | 1/1998 |

* cited by examiner

Comparing algorithm (ideal case: no noise)

Calculation of the Digital Trend Waveform

Comparing algorithm (ideal case: no noise)

Comparing algorithm (non-ideal case: noise)

Calculation of LOF (n=6)

Signal Acquisition & Filtering

METHOD AND APPARATUS FOR MONITORING AND DETERMINING THE FUNCTIONAL STATUS OF AN ELECTROMAGNETIC VALVE

FIELD OF THE INVENTION

The present invention relates to a method and apparatus for monitoring and determining the functional status of a valve, and, more particularly, determining when a valve should be replaced to assist in preventative maintenance.

BACKGROUND OF THE INVENTION

In fluid power applications, valves are used to control actuators or pilot other valves in a fluid power circuit. One common type of valve is a solenoid activated valve. Such a valve uses a coil which surrounds an armature or plunger. When the coil is energized, a magnetic field is created, which causes the plunger to move. This movement can cause a fluid passage to open allowing the fluid to flow to the next member in the circuit. Alternatively, the fluid passage allows the fluid to flow and act on a valve member, such as a spool, thereby shifting the valve. The plunger could alternatively be directly connected to the valve-shifting member.

In a solenoid activated valve the plunger typically is moved against the biasing force of a spring. When the coil is energized the plunger moves, compressing the spring and allowing the valve to shift. When the coil is de-energized, the spring force urges the plunger back to its initial position. This behavior is cyclic in nature, since the action of the plunger is repeated over and over again under the same conditions. Accordingly, the behavior of the plunger should be the same for each cycle.

After a repeated number of cycles, valves may begin to wear and their function degrades. Valve degradation may be caused by a sticking plunger, a weak coil or a failing spring. The valve may still function but at a reduced efficiency. For example, air may leak or the valve may shift more slowly. It is often very difficult to determine which valves are in this state without removing the valve from its circuit and conducting tests. Even before complete valve failure, the machine or circuit in which it functions will be compromised. Once a valve completely fails, immediate maintenance is required. This can interrupt production and result in significant costs.

To avoid such unexpected failures, components such as valves may be replaced after a fixed period of time. However, fully functioning components may be needlessly replaced.

Also, the use of sensors to track the condition of the various valve components would require additional hardware, and require significant computational and memory storage to process all the signal information.

Accordingly, it would be desirable to have a system that monitors valves and efficiently determines the functional status of the valves in order to permit maintenance to be performed in a cost-effective manner.

SUMMARY OF THE INVENTION

The present invention provides a method and apparatus for monitoring the functional status of a solenoid actuated valve.

The present invention also provides a method and apparatus for monitoring the functional status of a solenoid actuated valve based on an electro-mechanical switching time of the valve.

The present invention further provides a method and apparatus for monitoring the functional status of a solenoid actuated valve by determining the electro-mechanical switching time of the valve based on an electrical characteristic responsive to the solenoid. The characteristic may be the supply current to the valve.

The present invention still further provides an algorithm responsive to the change in supply current to the solenoid coil for determining the electro-mechanical switching time.

The present invention provides a method of determining the functional status of an electromagnetic valve having a solenoid and plunger including the steps of:

determining the electro-mechanical switching time of a valve based on characteristics of the current supplied to the solenoid;

comparing the valve electro-mechanical switching time to a predetermined value; and generating a valve status signal dependant on the results of the comparison.

The present invention also provides a method of monitoring the functional status of an electro-mechanical valve having a solenoid coil and plunger comprising the steps of:

energizing the solenoid coil to initiate movement of the solenoid plunger from a first position to a second position;

acquiring a signal relating to an electrical characteristic responsive to the solenoid;

starting a first and second timer;

performing an algorithm on the signal to determine when the plunger reaches the second position;

determining an electro-mechanical switching time based on the plunger movement; comparing the switching time to predetermined tolerance values; and indicating a functional status of the valve.

The present invention further provides an apparatus for determining the functional status of an electromagnetic valve having a solenoid and plunger including a sensing circuit for sensing the current to be supplied to the valve. An electro-mechanical switching time detector operably connected to the sensing circuit. The detector determines the electro-mechanical switching time of a valve based on characteristics of the current supplied to the solenoid. A comparator is provided for comparing the valve switching time to a predetermined value. An indication device is provided for indicating the valve status dependant on the results of the comparison.

The present invention still further provides an apparatus for determining the functional status of an electromagnetic valve having a solenoid coil and plunger including a sensing circuit for sensing the current to be supplied to the valve. An electro-mechanical switching time detector is operably connected to the sensing circuit. The detector evaluates the current to determine when the plunger has moved from a first position to a second position based on an electrical characteristic responsive to the solenoid coil. The detector determines the electro-mechanical switching time, $t_{ems}$, based on the position of the plunger. A comparator compares the $t_{ems}$ to a predetermined value. An indicator indicates the valve status depending on the results of the comparison.

DETAILED DESCRIPTION OF THE PREFERRED EMBODIMENTS

The present invention includes a method and apparatus for enabling a user to assess the functional status of solenoid valves including its mechanical and electrical components. The invention presents a diagnostic tool which detects and compares cyclically the value of the parameter describing the dynamic performance of a solenoid valve with a reference value of this parameter. This tool determines whether or not the measured value is within certain tolerances around the reference value.

Figure 1:
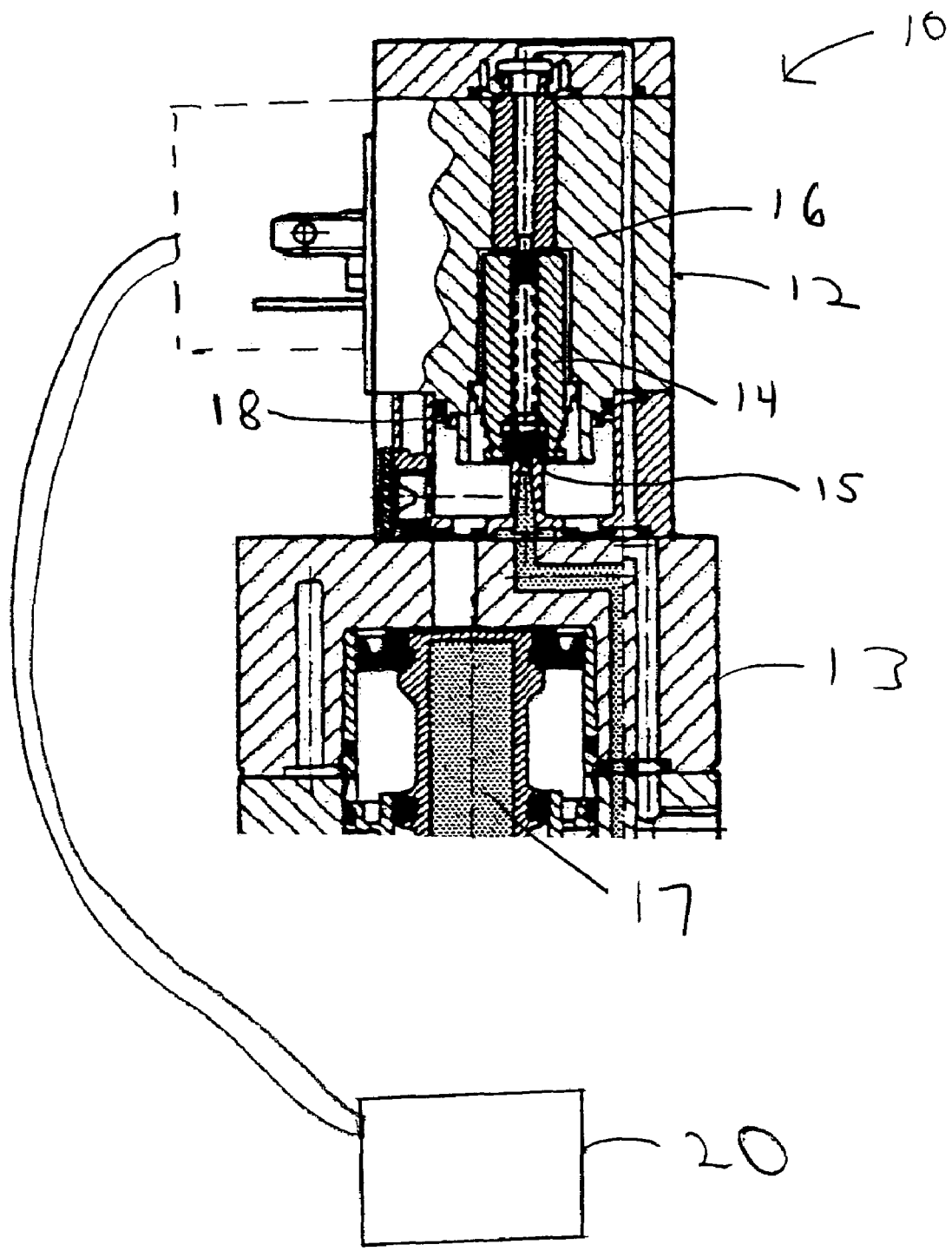
FIG. 1 is a partial cross-sectional view of a solenoid actuated valve.

With reference to FIG. 1, the type of valves to be monitored are preferably valves 10 having electro-mechanical actuator 12 attached to a valve body 13. One such valve may be a piloted valve in which actuator 12 may include a movable armature also referred to as a plunger 14 disposed within a stationary conductive solenoid coil 16 through which current may flow. Energizing the coil creates a magnetic field that moves the plunger. The plunger 14 may selectively cover and uncover a pilot hole 15 allowing pressurized fluid to shift the valve spool 17. Alternatively, the plunger may be directly connected (not shown) to a valve spool in what is know as a direct-controlled valve. The plunger may be biased in a first position by way of a spring 18. The solenoid coil 16 is typically operably connected to a valve controller 20 that selectively supplies current to the coil. In a preferred embodiment, the valve controller 20 may include a sensing circuit which senses an electrical characteristic responsive to the solenoid and generates a signal corresponding to the sensed characteristic, such as the current. The characteristic is preferably the current supplied to the solenoid coil. A current sensing circuit 22, which is described below with reference to FIGS. 12A and 12B, allows the current to the coil to be monitored.

In the present invention, the sensed current may be used to determine the status of the solenoid valve. When the coil 16 is energized, the plunger 14 moves from a first end position to a second end position, thereby shifting the valve. Valve solenoid coils may be initially subjected to a relatively high voltage in order to quickly move the plunger from the first position and overcome inertial, frictional, and spring forces. This is referred to as over-exciting the coil. The over-excitation may be obtained either by using a charging capacitor or an appropriately supplied over-voltage in a manner well known in the art. Once the plunger 14 has reached the second position and has completed its movement, the voltage is lowered to a holding, or hold open, level to maintain the plunger in the second position.

The movement of the solenoid plunger 14 within the electro-mechanized actuator 12 constitutes a cyclic system, meaning the same event occurs repeatedly over and over again, i.e., the same plunger is moving the same distance, against the same spring, under the same coil current. Therefore, it can be expected that a characteristic of the system, such as how long it takes the plunger to move for one cycle, should be the same for other cycles. If this is not the case, a change in the characteristic provides information as to the condition of the valve.

The electro-mechanical switching time, $t_{ems}$, is defined as the time elapsed from switching-on the power source of a solenoid valve to the time when the valve plunger has finished its movement. The electro-mechanical switching time of the plunger has been found to provide valuable information as to the fitness of the valve 10. For a valve that is working properly, the $t_{ems}$ will fall within a particular range. This range depends on the particular features of the valve. If the plunger travel takes longer than an acceptable amount of time, this may indicate that the plunger is sticking or that the coil is malfunctioning. If the plunger travels too quickly, this may indicate that the spring has failed.

Figure 2A:
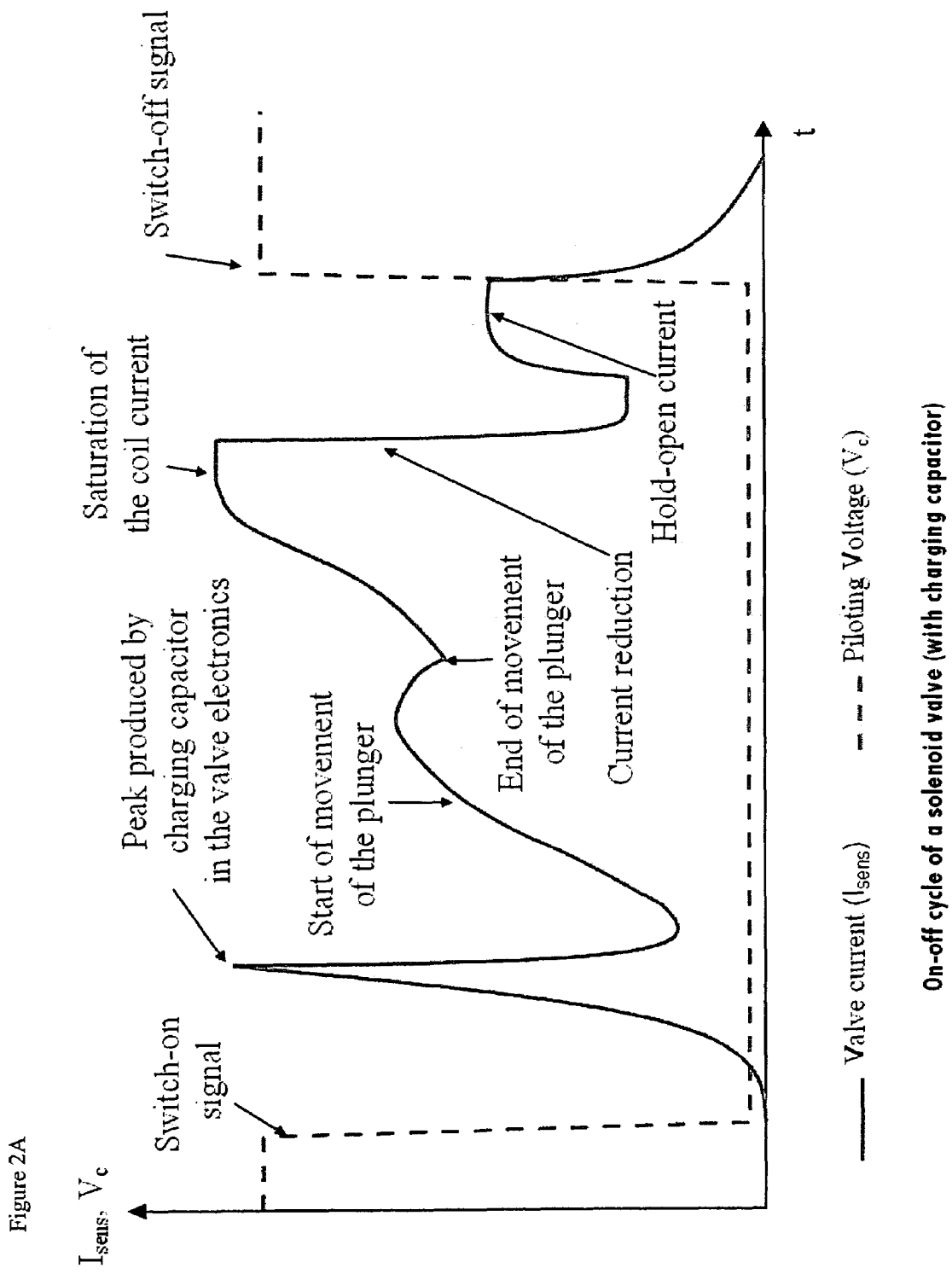
FIG. 2A is a graphical representation of a valve supply current and voltage verses time having a charging capacitor.
Figure 2B:
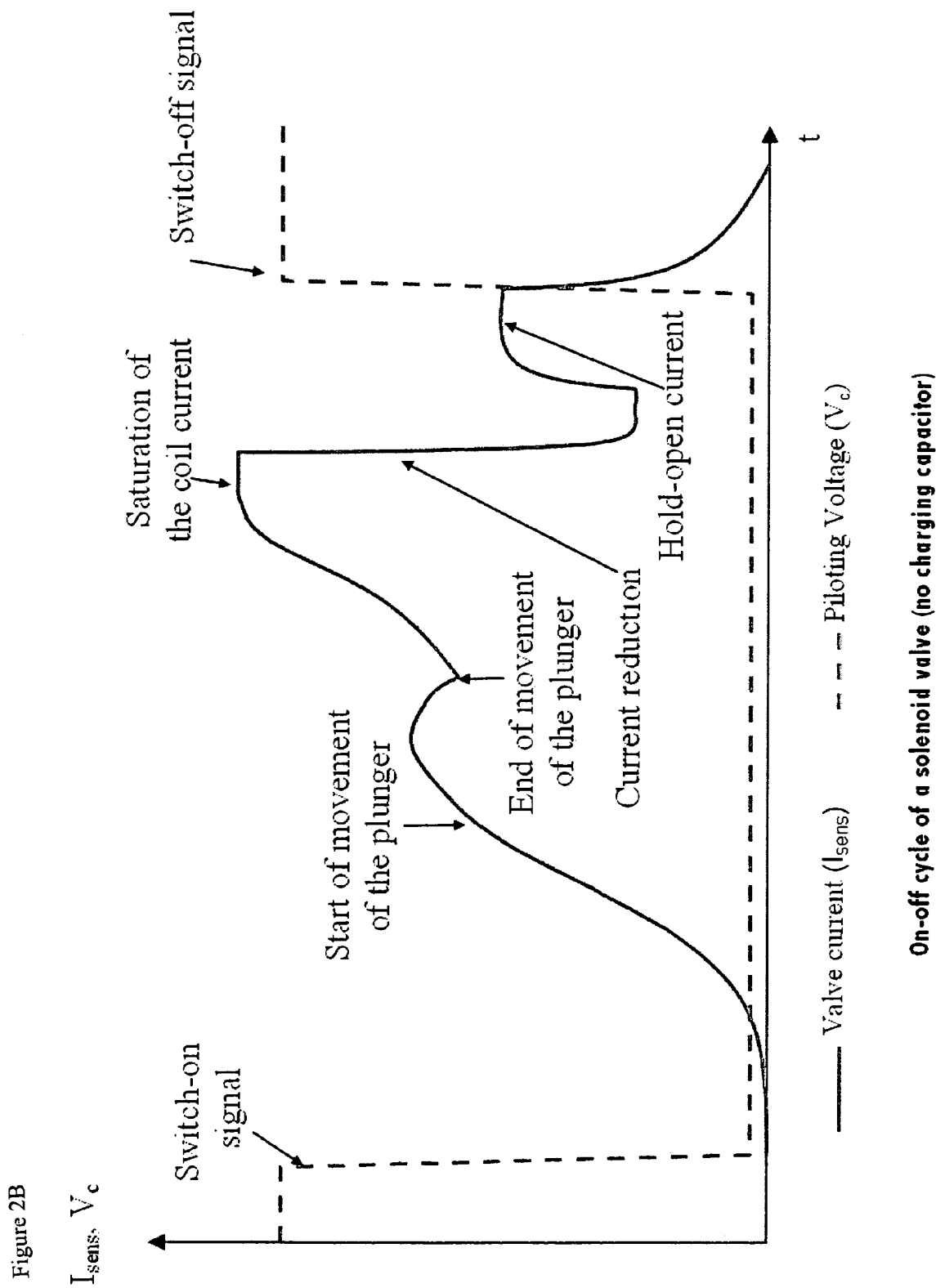
FIG. 2B is a graphical representation of a valve supply current and voltage verses time having no charging capacitor.

The present invention determines the electro-mechanical switching time by monitoring and evaluating the voltage signal and supply current to the valve. As shown in FIGS. 2A and 2B, the sensed current, $I_{sens}$, supplied to the valve solenoid changes over time, t. When the valve is switched on, the current rises to a point when the plunger starts to move from its first position. The current may continue to increase at a slower rate until it begins to decline. At the end of the plunger movement, when the plunger is in its second position, the current will again begin to rise until a coil saturation point. This change in the slope of the current at the time when the plunger stops moving from negative to positive permits the mechanical switching time to be calculated from analyzing the current. The current may then be reduced to a holding current which maintains the plunger in the open position. When the valve switch-on signal is dropped, the current likewise drops, and the plunger will return to the first or closed position under the force of the spring. FIG. 2A illustrates the current curve for a valve including a charging capacitor. A charging capacitor is preferably part of the valve electronics which is placed within the valve housing, in a manner well known in the art. The charging capacitor in the valve electronics leads to shorter switching times of the valves, and therefore, may be used in fast switching valve types. FIG. 2B illustrates the current curve for a valve without a charging capacitor.

Figure 3:
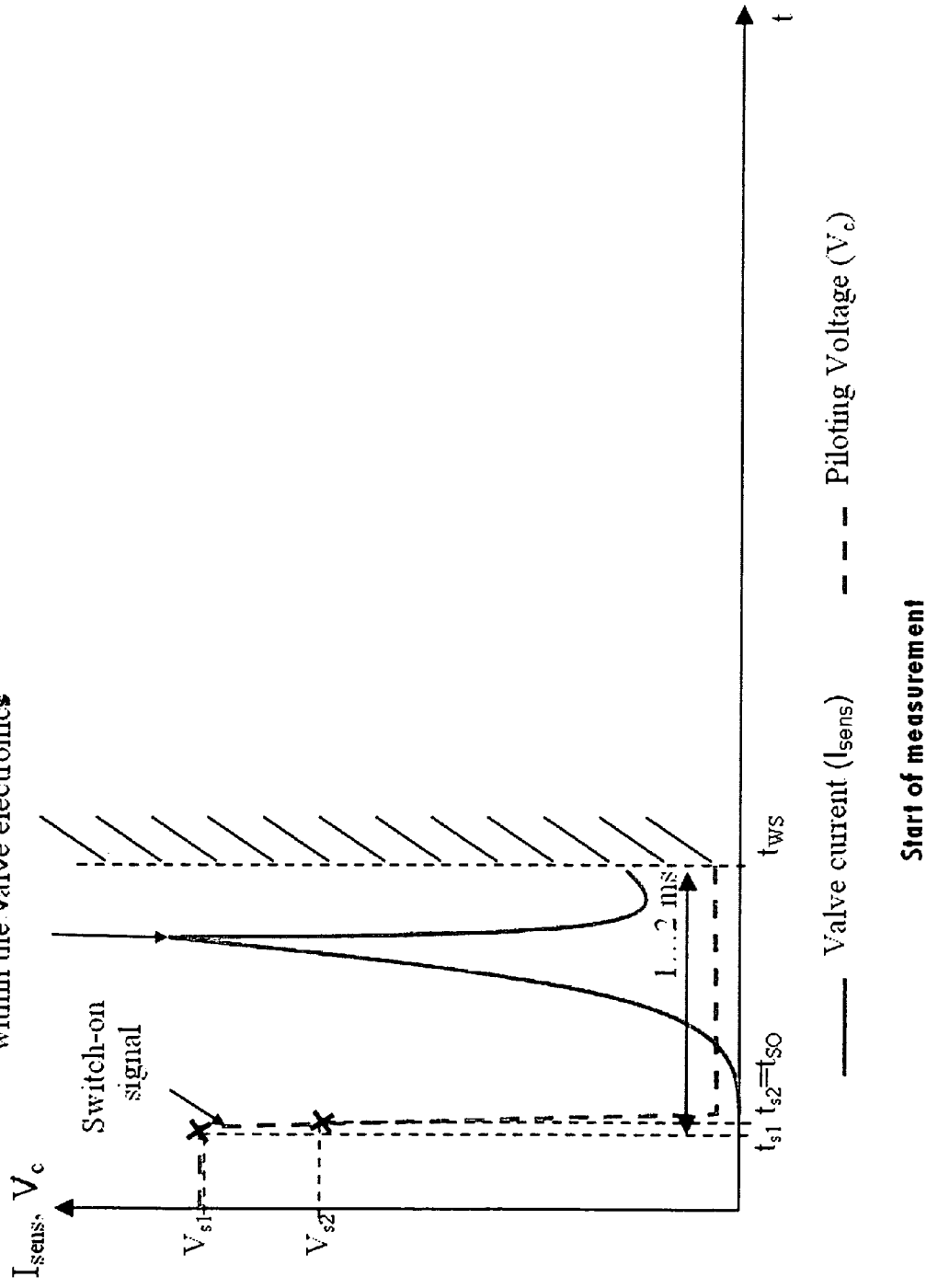
FIG. 3 is a graphical representation of the beginning of the valve supply current.

In a preferred embodiment, in order to calculate the mechanical switching time based on the supply current, first a time window, $t_w$, may be created. The time window helps isolate the portion of the current curve which provides the information relevant to determining the end of the plunger movement. Detection of the change in slope of the current curve takes place within the time window. Referring to FIG. 3, the power up condition is detected by way of the piloting voltage Vc which changes the on-off status of the valve. The piloting voltage is described in detail with respect to FIGS. 12A and 12B. In the preferred embodiment, when the pilot voltage goes low the valve is switched on. When a negative slope, $\Delta V = V_{s2} - V_{s1}$, is detected and it is less than a certain negative threshold value $\Delta V_{th}$, this constitutes the switch-on time. In FIG. 3, the switch-on time is $t_{SO} = t_{s2}$.

In order to prevent the detection circuitry from detecting events that may lead to false results in regard to the electro-mechanical switching time, e.g., noise or current peak produced by a charging capacitor, and to prevent the detection circuitry from being exposed to high voltage level signals, the time window may be started with a certain delay after the switch-on condition is detected. Since the current curve depends on the size of the charging capacitor and the solenoid time constant, this delay is preferably determined individually for each valve type or model. For the embodiment set forth herein, a time delay of 1 ms to 2 ms is used for exemplary purposes. Therefore, as shown in FIG. 3, 2 ms after the power up condition is detected, the time window starts, $t_{WS}$. Other delay times may be used.

Figure 12A:
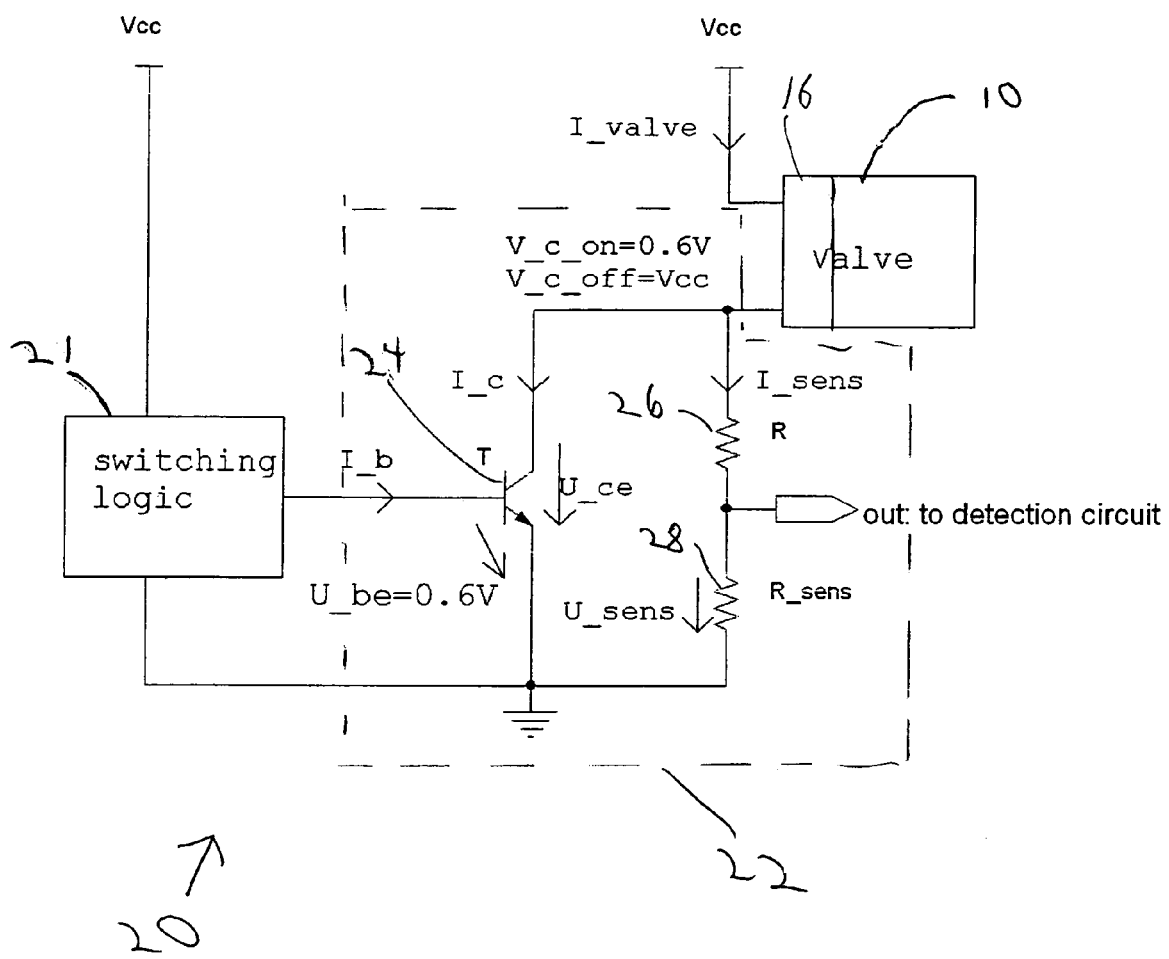
FIG. 12A is a schematic of a valve switching circuit.

The solenoid supply current is preferably measured by way of the sensing resistor R_sens within the voltage divider as shown in FIG. 12A. The sensor signal then may be digitized by an analog-to-digital converter and stored in a First In First Out memory (FIFO). It is within the contemplation of the present invention that other means for measuring and storing the current could be employed.

Figure 4:
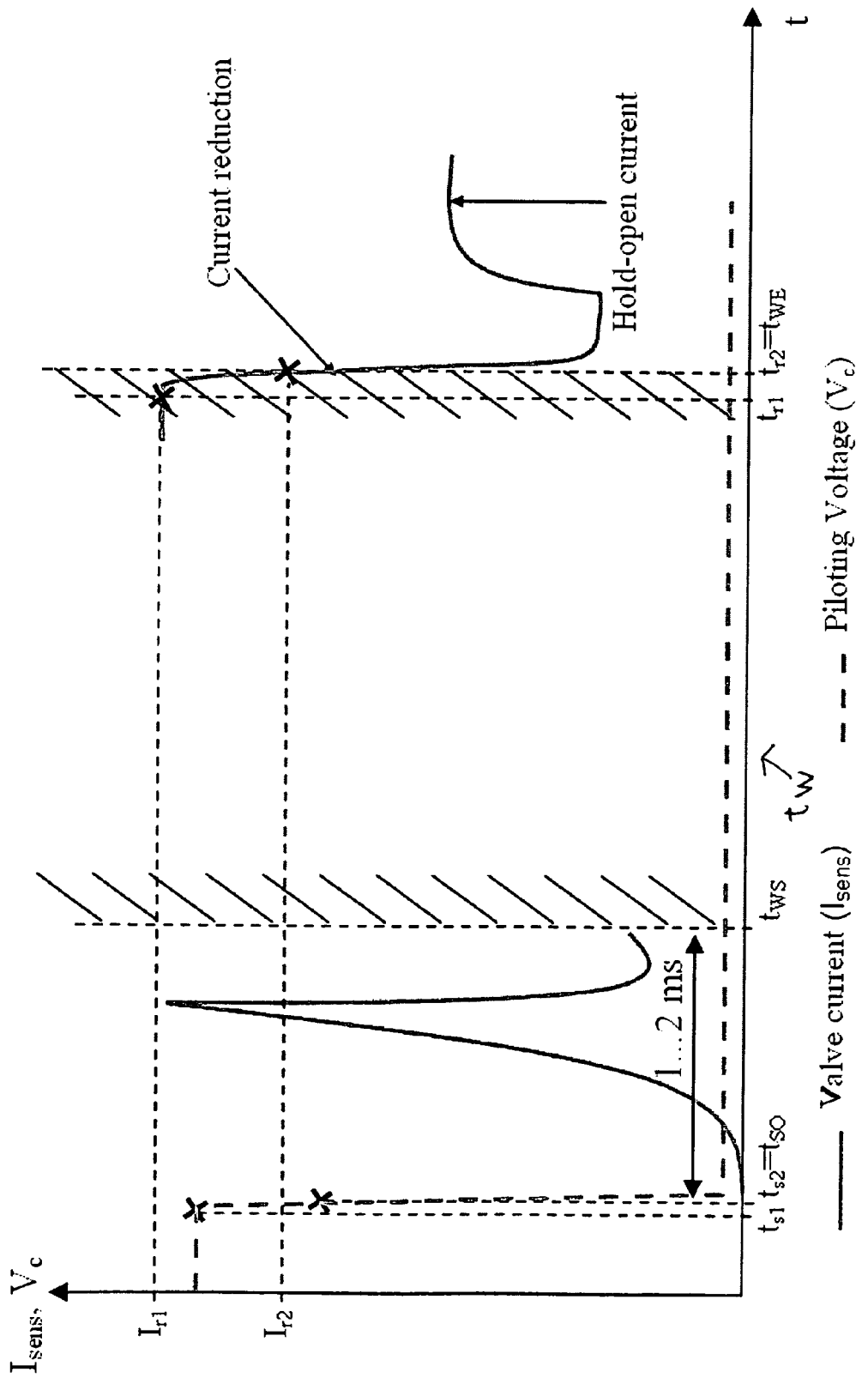
FIG. 4 is a graphical representation of a valve supply current and piloting voltage at the beginning and the end of a measurement time window.

Referring to FIG. 4, the end of the measurement and of the time window may be detected by looking for the current reduction to the solenoid coil. Current reduction occurs after the plunger has moved into the second position when only a lower holding current is required. Current reduction can take place at a predetermined time after the valve has been switched on. Current reduction is indicated by a high negative slope of the current curve. The condition is met when $\Delta I = I_{r2} - I_{r1}$ is less than a predetermined negative threshold value. The end of the time window $t_{WE}$ occurs at $t_{r2}$.

Alternatively, if the valve is not subject to over-excitation, then there will be no current reduction. Therefore, a predetermined time, or Time to Measure, may be used to determine the end of the time window. This time will be dependent on the type of valve and can be empirically determined.

Figure 5:
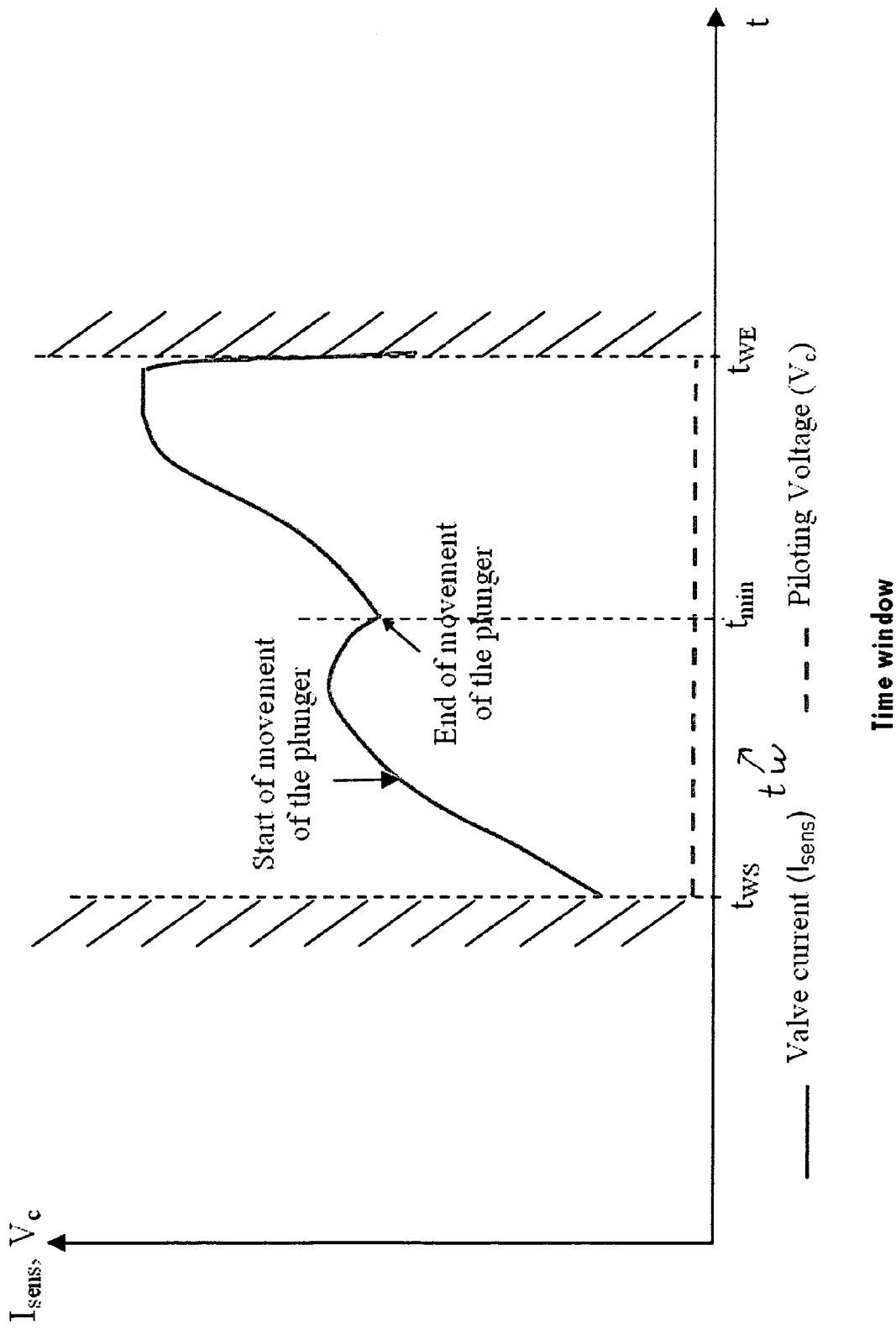
FIG. 5 is a graphical representation of a valve supply current and piloting voltage within the time window for measurement.

With the time window defined, as shown in FIG. 5, the behavior of the current within that window may be detected and evaluated to determine plunger movement and, ultimately, the mechanical switching time $t_{ems}$. The current is evaluated within the window, and a decline in the current followed by an increase indicates the end of the plunger's movement.

Figure 6:
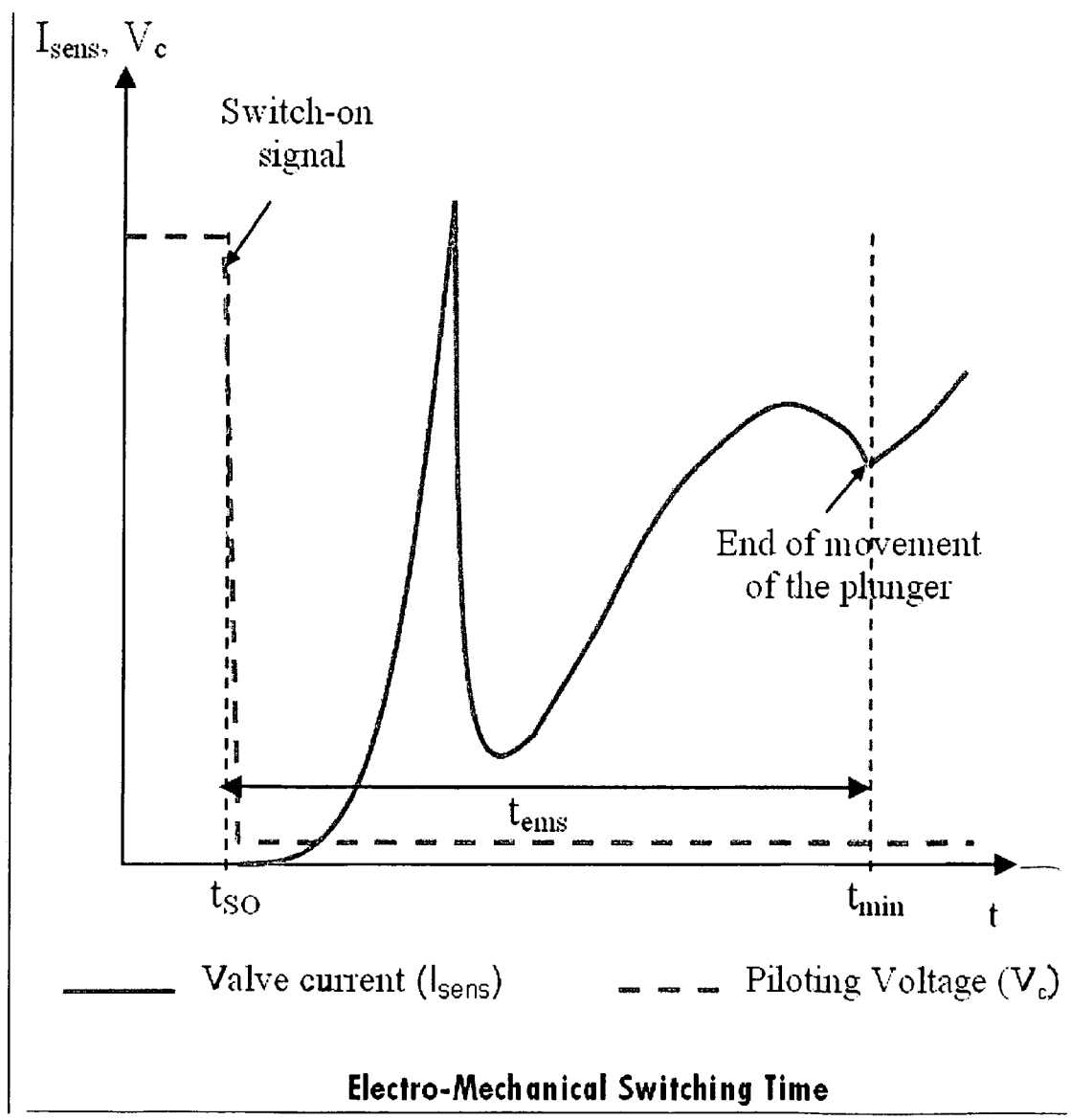
FIG. 6 is a graphical representation of a valve supply current and piloting voltage showing the electro-mechanical switching time.
Figure 7:
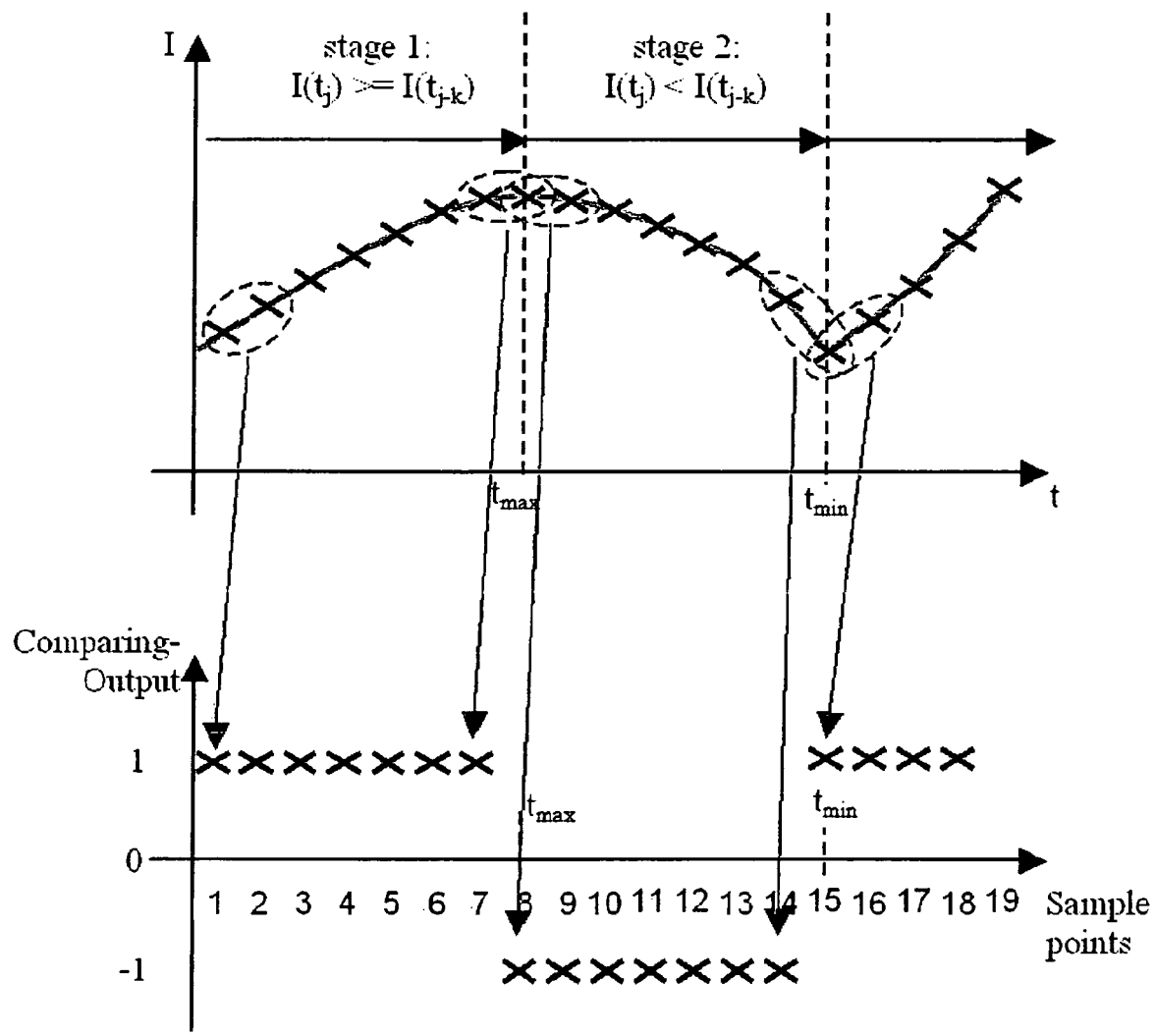
FIG. 7 is a graphical representation of the valve supply current curve showing sample data points for the comparing algorithm of the present invention.

The change in slope of the solenoid supply current curve may be detected using an algorithm, based on data derived from the sensed current supplied to the coil. Referring to FIGS. 6 and 7, in a first embodiment, a comparing algorithm is used which compares the successive points, separated by time k of the current curve from the start of the time window $t_{ws}$ at $t \geq t_{WS}$.

The algorithm starts a first stage with comparing successive points of the current curve during the time window $I(t_{j+k}) > I(t_j)$. When $I(t_{j+1}) > I(t_j)$=false, this indicates that the current is dropping and the local maximum of the current curve has been reached. The algorithm then enters a second stage and starts comparing the current as follows: $I(t_{j+k}) < I(t_j)$. The local minimum is detected as soon as $I(t_{j+k}) < I(t_j)$=false, since the current is now rising. This point, $t_{min}$, indicates the end of the plunger movement.

As shown in FIG. 6, the electro-mechanical switching time is calculated as the difference between the switch-on signal $t_{so}$ and the time of the end of plunger movement $t_{min}$.

In order to make this comparing algorithm more stable, i.e. make it less sensitive to noise, the time increment k between the data points to be compared can be increased.

Example with k=1:

Stage 1:

$I(t_2) > I(t_1)$=true;

$I(t_3) > I(t_2)$=true;

$I(t_4) > I(t_3)$=false;

Go to Stage 2

Stage 2:

$I(t_5) < I(t_4)$=true;

$I(t_6) < I(t_5)$=false;

Local minimum detected;

Calculate electro-mechanical switching time.

Figure 8:
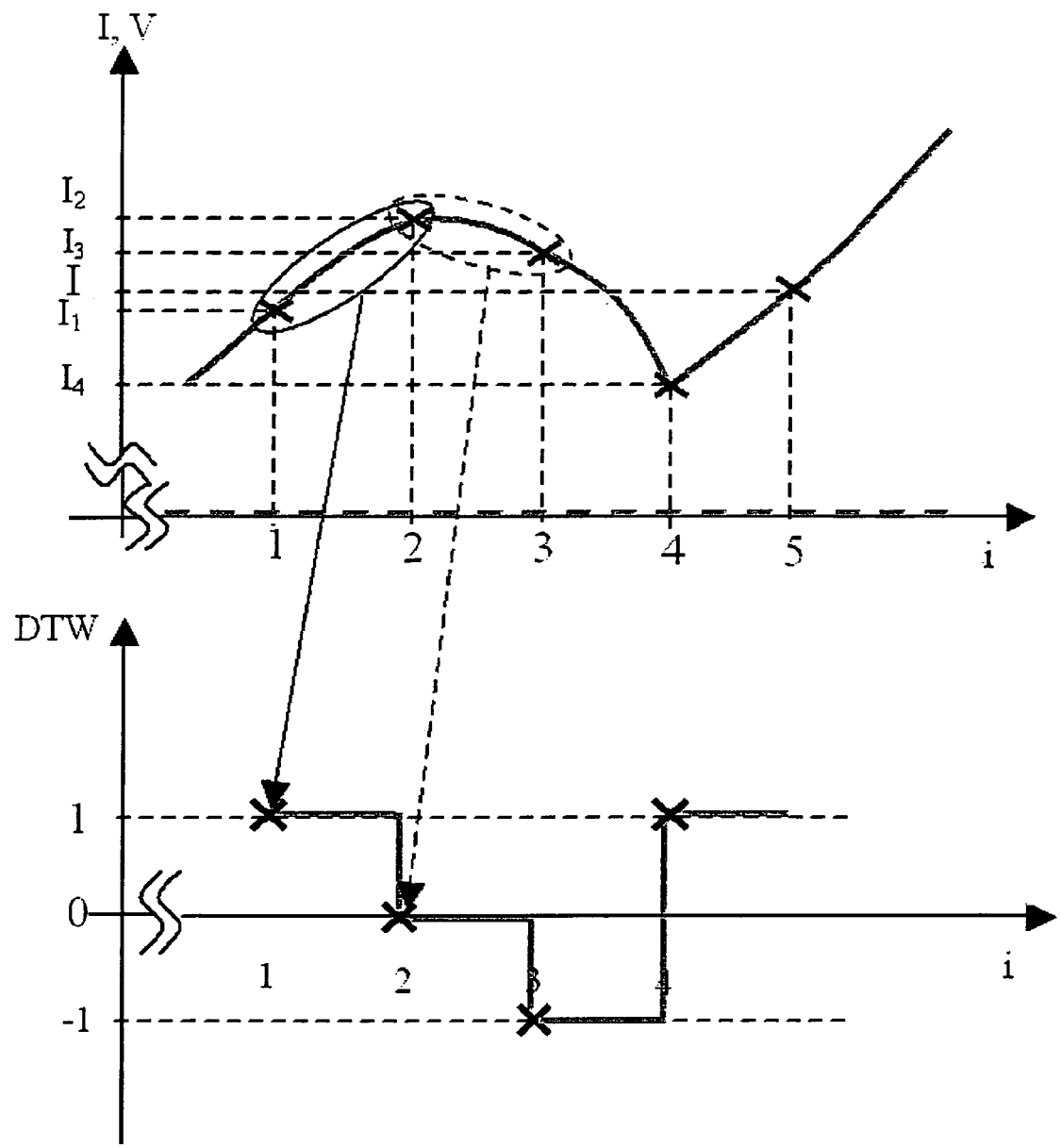
FIG. 8 is a graphical representation of the valve supply current curve showing sample data points for the Digital Trend Waveform algorithm of the present invention.

With reference to FIG. 8, in an alternative embodiment, a digital trend waveform ("DTW") algorithm may be used to evaluate the current and determine the end of the plunger movement. In this algorithm, successive data points are compared. If the later point is greater than the previous point, then the digital trend waveform value is assigned a value of 1. If the later point is less than the prior current point then the DTW value is assigned a value of –1. A local minimum or maximum of the current curve would result in a transition from "–1" to "1" or from "1" to "–1", respectively. In the comparing algorithm described above, one free parameter, preferably the time increment k between two neighboring data points is used. In the DTW algorithm, two free parameters may be used, preferably the time increment k and a tolerance $a_t$. The change in the current value between two neighboring points must exceed the difference $a_t$ in order to be recognized as a change. Therefore, parameter $a_t$ may be introduced to help account for local fluctuations in the current curve.

If the current at the next point (i+k) is increased by at least the tolerance $a_t$ compared to the value at point k, then the DTW is +1, or mathematically:

If $I_{i+k} > (1+a_t) * I_i$ then $DTW_i = 1$.

If the current at the next point (i+k) is decreased by at least the tolerance $a_t$ smaller than at point k, then the DTW is –1 or mathematically:

If $I_{i+k} < (1-a_t) * I_i$ then $DTW_i = -1$.

If the current at the next point (i+k) is within the tolerance band +$a_t$ of −$a_t$ compared to point k, then the DTW is zero or mathematically:

If $(1-a_t)*I_i<I_{i+k}<(1+a_t)*I_i$, then $DTW_i=0$.

With further reference to FIG. 8, an example of the DTW is as follows:

Given: $a_t=\pm0.05$, $k=1$:

$I_2>1.05*I_1$: $DTW_1=1$ $0.95*I_2<I_3<1.05*I_2$: $DTW_2=0$ $I_4<0.95*I_3$: $DTW_3=-1$ $I_5>1.05*I_4$: $DTW_4=1$

In this example, the discontinuity permits the output of the DTW to change immediately from "−1" to "1" at the data point 4. This point represents the end of the plunger movement. With the end of plunger movement determined, the electro-mechanical switching time, $t_{ems}$, can then be calculated.

Figure 9:
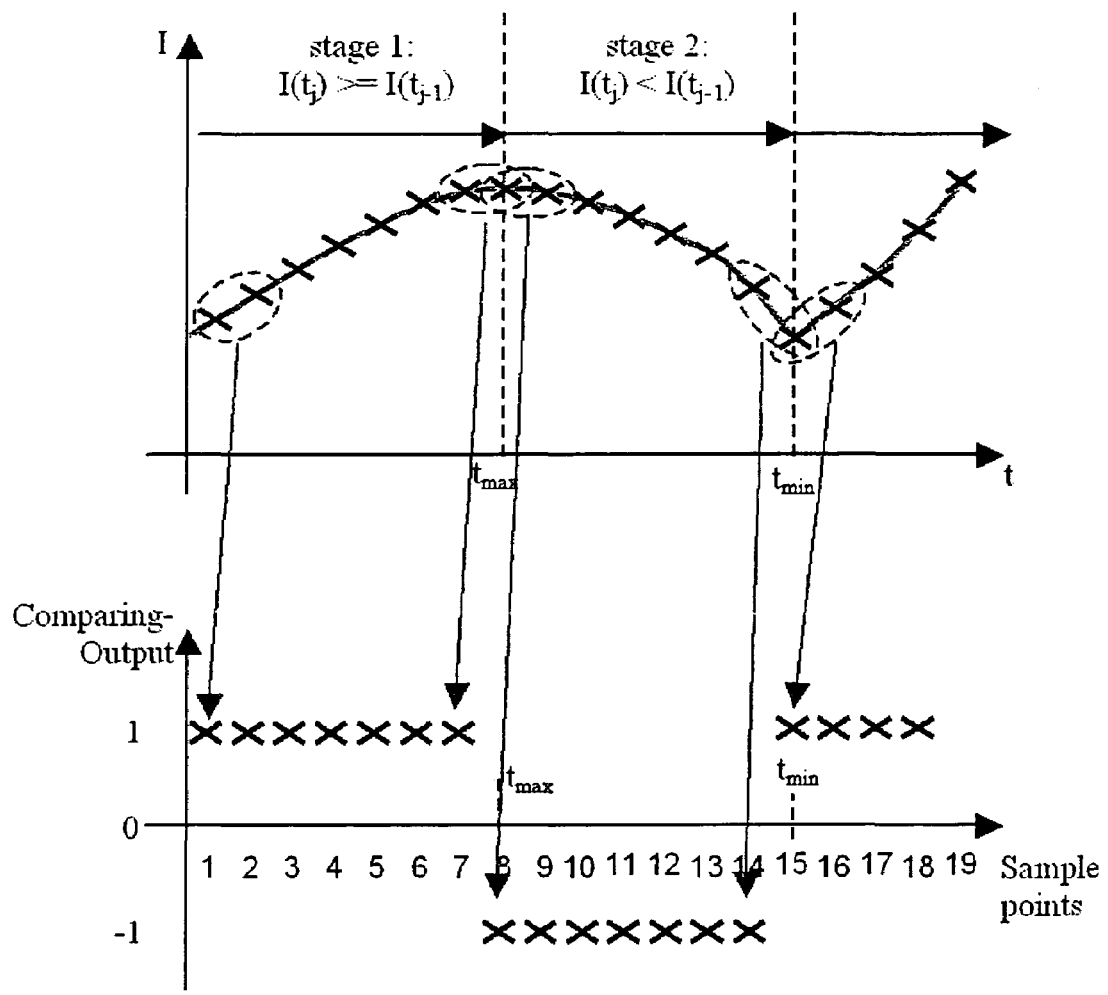
FIG. 9 is a graphical representation of the valve supply current curve showing sample data points for the comparing algorithm with the distance between data points, k equal to 1.
Figure 10:
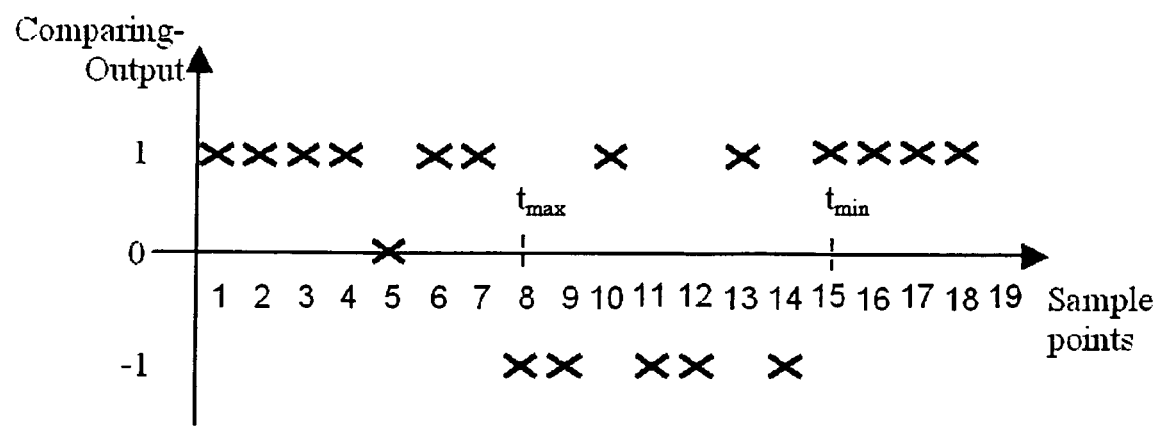
FIG. 10 is a graphical representation of the output of the comparing algorithm with noise present.
Figure 11:
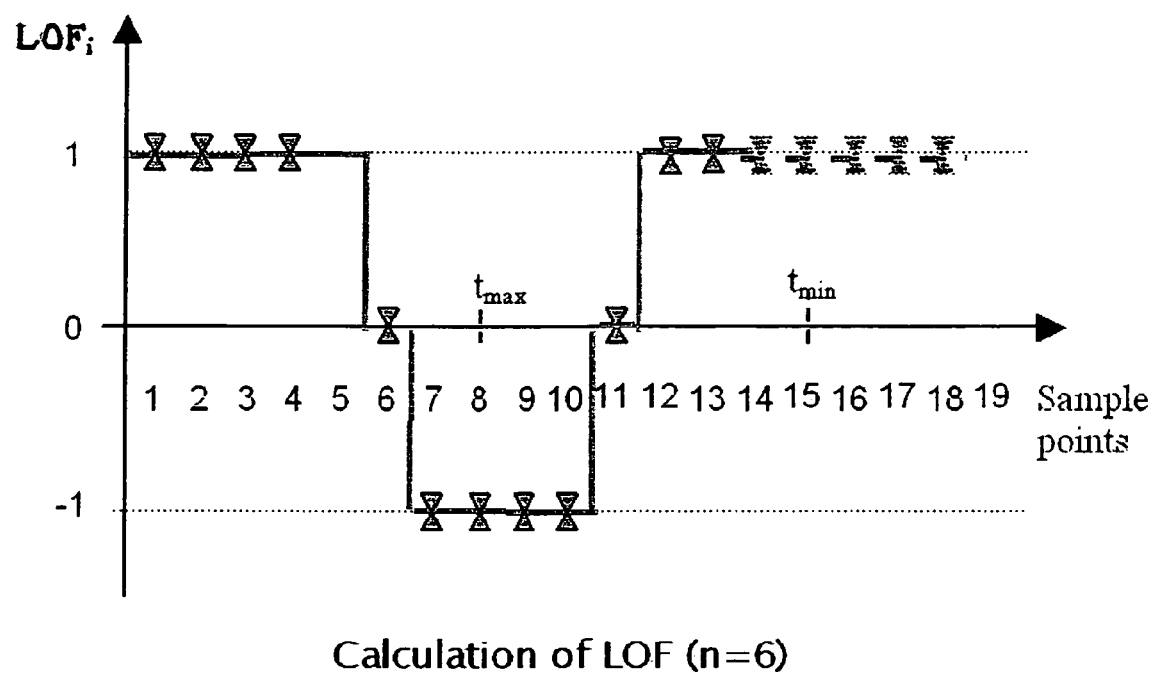
FIG. 11 is a graphical representation of the output of the Logic-Output Filter.

With reference to FIGS. 9 through 11 in a further alternative embodiment, the end of the plunger movement is determined by using a logic-output filter ("LOF") algorithm. This algorithm detects the arrival of the plunger at its end position (see FIGS. 2A and 2B) by detecting a transition from negative to positive slope in the current curve at the local minimum. This algorithm does not use a tolerance at. Accordingly, the noise-influenced current curve is used as the input to the LOF. The output of the comparing algorithm with distance k=1 between the current values to be compared provides positive or negative values for a positive and a negative slope, respectively, as shown in FIG. 9. However, due to noise present in the current curve, the output of the comparing algorithm may not be stable as shown in FIG. 10. Therefore, the comparing algorithm may be enhanced by feeding the non-ideal output of the comparing algorithm through the LOF algorithm to eliminate the noise as shown in FIG. 11.

The LOF algorithm may consist of the following steps:
Count positive and negative values of the output of the comparing algorithm in a sample-point frame of n samples. The number of data points within a frame is discretionary.

If the number of positive values in that frame is greater than the number of negative values:

LOF=1

If the number of negative values in that frame is greater than the number of positive values:

LOF=−1

If the number of the positive and negative values is equal:

LOF=0 or if all values are zeros:

LOF=0

EXAMPLE

The output of the comparing algorithm (non-ideal case FIG. 10) is used as an input for the LOF with the results shown in FIG. 11. The frame size in this example is 6; however, other frame sizes could be used. The LOF example is set forth below:

i=1 ... 6:
Number of pos. current values: $\Delta I_{i+}=5$
Number of neg. current values $\Delta I_{i-}=1$
Number of zero values: $\Delta I_{i0}=0$ $LOF_1=1$ i=2 ... 7:
Number of pos. current values: $\Delta I_{i+}=5$
Number of neg. current values: $\Delta I_{i-}=0$
Number of zero values: $\Delta I_{i0}=1$ $LOF_2=1$ i=6 ... 11:
Number of pos. current values: $\Delta I_{i+}=3$
Number of neg. current values: $\Delta I_{i-}=3$
Number of zero values: $\Delta I_{i0}=0$ $LOF_6=0$ i=7 ... 12:
Number of pos. current values: $\Delta I_{i+}=2$
Number of neg. current values: $\Delta I_{i-}=4$
Number of zero values: $\Delta I_{i0}=0$ $LOF_7=-1$ i=11 ... 16:
Number of pos. current values: $\Delta I_{i+}=3$
Number of neg. current values: $\Delta I_{i-}=3$
Number of zero values: $\Delta I_{i0}=0$ $LOF_{11}=0$ i=12 ... 17:
Number of pos. current values: $\Delta I_{i+}=4$
Number of neg. current values: $\Delta I_{i-}=2$
Number of zero values: $\Delta I_{i0}=0$ $LOF_{12}=1$ Using the LOF in conjunction with the comparing algorithm helps eliminate errant signals caused by noise on the current signal. As shown in FIG. 11, the change from a local minimum to a local maximum on the current curve is clearly reflected around sample point 10.

In an alternative embodiment, to reduce the number of output levels (e.g. to ease a realization of this algorithm with a discrete circuit or to adapt the algorithm to the best working circuit) an alternative input-output relation can be used:

If the number of positive values in the considered frame is greater than the number of negative values:

LOF=1

If the number of the negative values prevails or if the number of positive and negative values is equal or if all values are zeros:

LOF=0

Each of the various algorithm embodiments set forth above, permits the time when the plunger movement ends to be calculated by evaluating the supply current to the solenoid. This information determines the electro-mechanical switching time. The $t_{ems}$ provides valuable information as to the functional status of the valve.

The present invention further includes verification of the measurements and a creation of the tolerances. The electro-mechanical switching time $t_{ems}$ depends on supply voltage $V_{supply}$ and switching frequency $f_{sw}$. The relationships of these parameters are as follows:
1) the higher $f_{sw}$ the shorter $t_{ems}$,
2) the higher (within certain range) $V_{supply}$ the shorter $t_{ems}$ Therefore, these parameters may be used to generate the tolerances of allowable deviation from optimal electro-mechanical switching time in order to prevent the diagnostic system from reporting a malfunction when none exists.

In an alternative embodiment, an additional parameter may be used for creation of the tolerances. This parameter is the relation between the duration of the "on" and of the "off" state of the electromagnetic valve (the so-called duty cycle).

One way to implement the dependency of $t_{ems}$ on the supply voltage into tolerance generation is to integrate the supply current over time. It includes the amplitude information of this signal summed over time. This way, a power supply malfunction such as too high or too low a supply voltage, or a malfunction of the charging capacitor (if applicable) can be detected. The implementation of the switching frequency into tolerance generation can be done by measuring the time distance between two switching cycles by means of a digital timer. A combination of measurements of the electro-mechanical switching time, of the integral of the sensor signal over time, and of the switching frequency improves the confidence of the measurement. Additionally, a higher number of fault conditions can be covered this way.

The above described functionality can be provided by a discrete circuit (containing non-programmable integrated circuits), as well as by a circuit consisting of one or more software-programmed integrated circuits. In the following, a block diagram principally representing the detection circuit will be described, together with the functions of the particular blocks of the present invention.

The valve controller 20 may include, or be operably associated with, a switching logic 21 and a current sensing circuit 22. The detection circuit, which is used to detect the end of the plunger movement, receives an input from the current sensing circuit 22. Current sensing circuit is capable of generating a signal which corresponds to the current supplied to the solenoid coil. In a preferred embodiment shown in FIG. 12A, the current sensing circuit 22 includes the valve solenoid of valve 10. In one embodiment, the "switching logic" 21 provides the npn-type switching transistor T, 24, with appropriate base current, thus changing the switching status of the valve 10. More particularly, the piloting voltage may be the voltage V_c (collector voltage of the npn-type transistor) at the low-side of the power supply of the valve as depicted in FIG. 12A. For a pnp arrangement shown in FIG. 12B, the voltage V_c (collector voltage of the pnp-type transistor) is at the high-side of the power supply of the valve. The voltage $V_c$ is controlled by the base voltage U_be and its value is complementary to U_be such that when U_be is low (=0V), then $V_c$ is high (=Vcc) and when U_be is high (approx 0.6V), then $V_c$ is low (approx. 0.6V). When $V_c$ is high the valve is off and when Vc is low the valve is switched on.

The voltage divider consisting of resistors R, 26, and R_sens, 28, adjusts the output voltage level (U_sens) to the input voltage range of the detection circuit as shown in the following equation:

$$U\_sens = U\_ce * R\_sens/(R+R\_sens)$$

Accordingly, the sensing circuit outputs a voltage signal which corresponds to the current, I_sens, supplied to the solenoid.

Figure 12B:
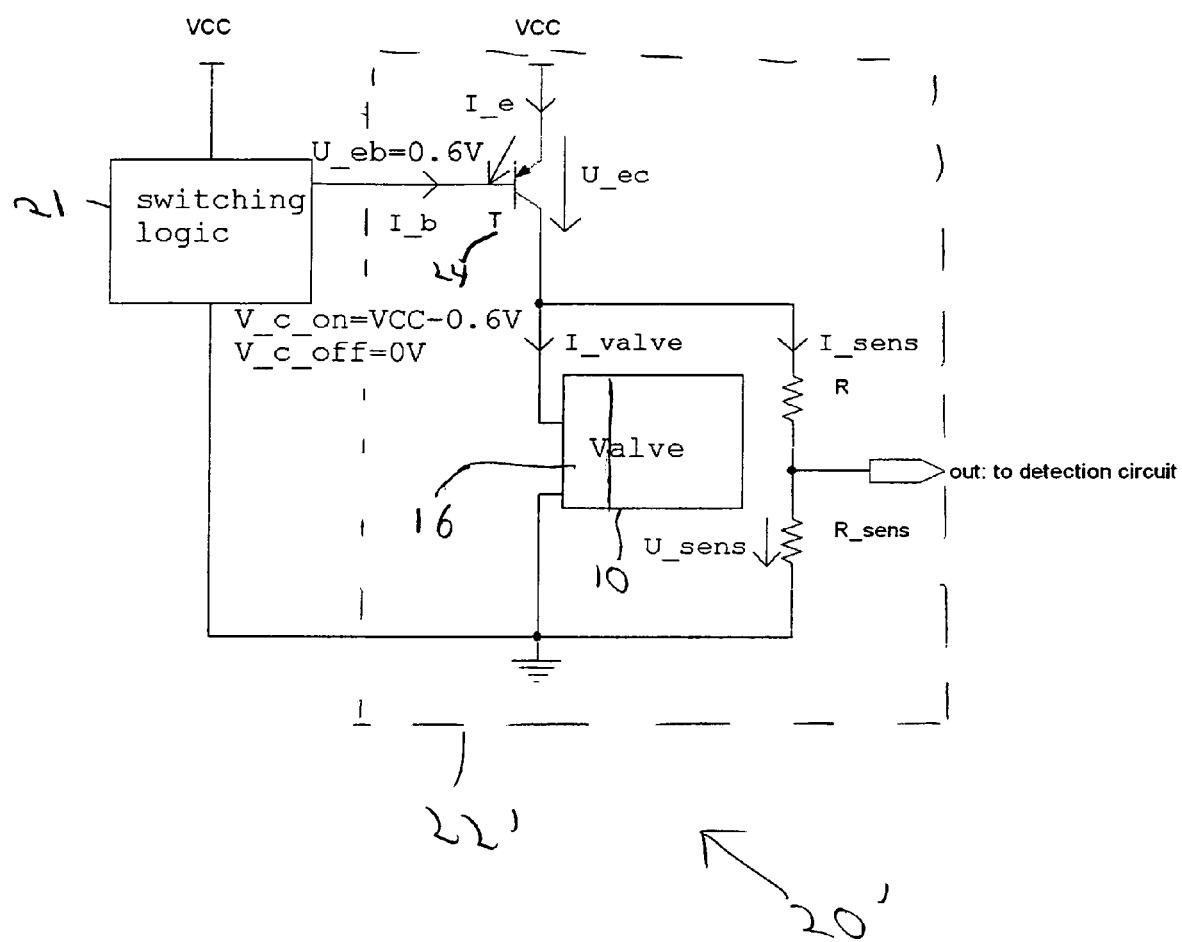
FIG. 12B is a schematic of an alternative embodiment of a valve switching circuit.

In an alternative embodiment shown in FIG. 12B, valve controller 20' includes sensing circuit 22' having a pnp-type switching transistor instead of an npn-type transistor. The arrangement of the resistors R and R_sens is changed accordingly. It is within the contemplation of the present invention that the current sensing circuit may have varying configurations as known in the art.

With reference to FIGS. 13 through 21, the various features of the preferred embodiment of the present invention can be broken down into functional blocks to facilitate description of the invention.

"Signal Acquisition & Filtering"

Figure 13:
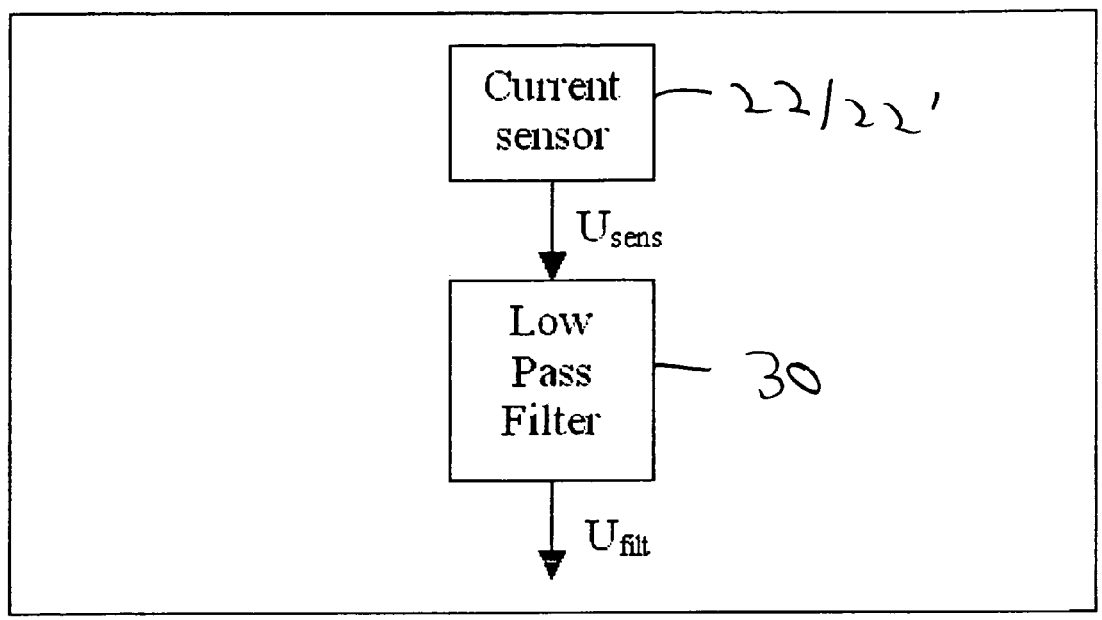
FIG. 13 is a block diagram of the signal acquisition and filtering of the present invention.

Referring to FIG. 13, the output signal of the current sensing circuit 22 may be a voltage $U_{sens}$ that is acquired and preferably filtered through a low pass filter 30 to remove high frequency noise from the signal to be measured. This creates a filter signal $U_{filt}$.

"Start of Measurement"

Figure 14:
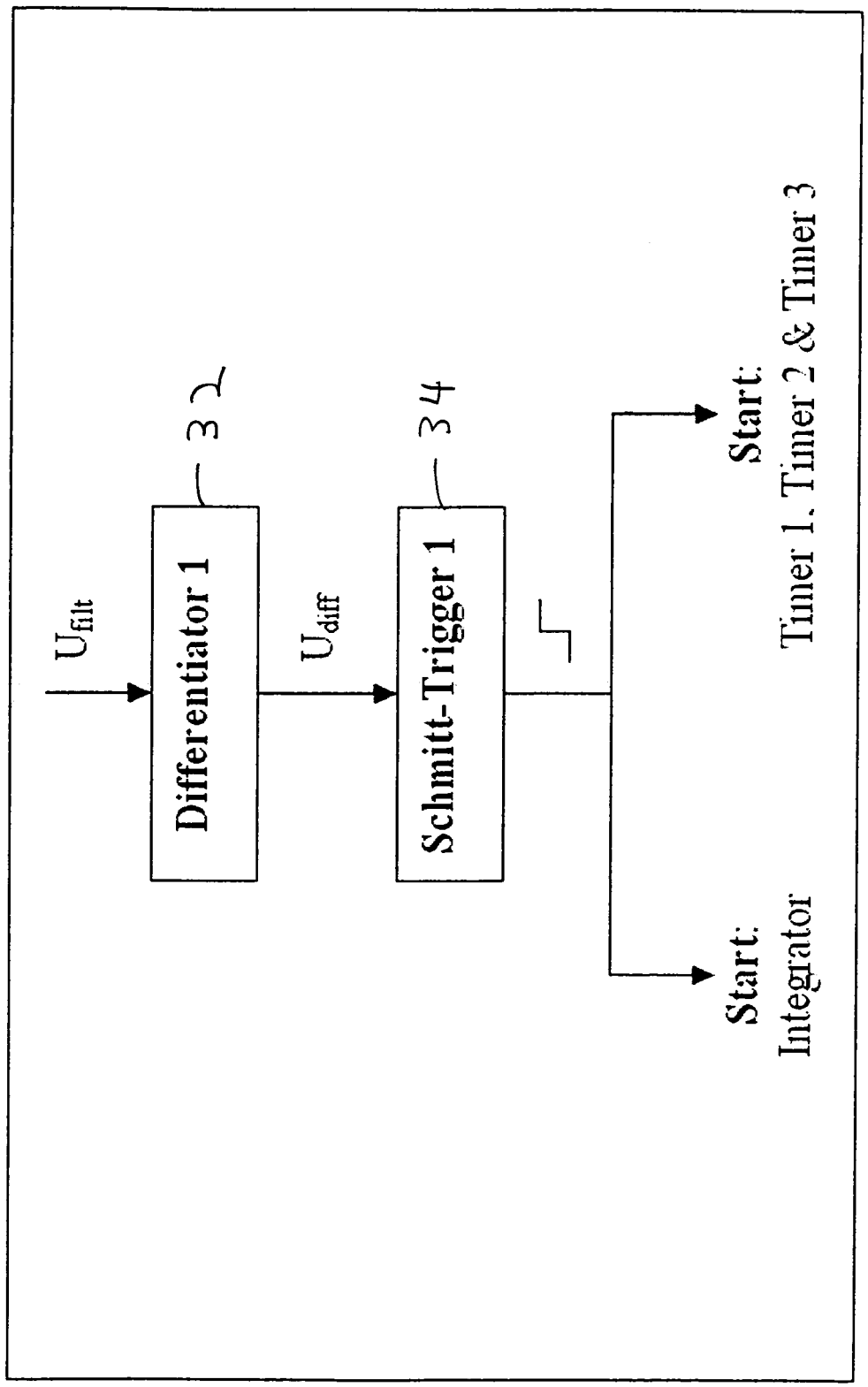
FIG. 14 is a block diagram of the start of the measurement of the electro-mechanical switching time.
Figure 15:
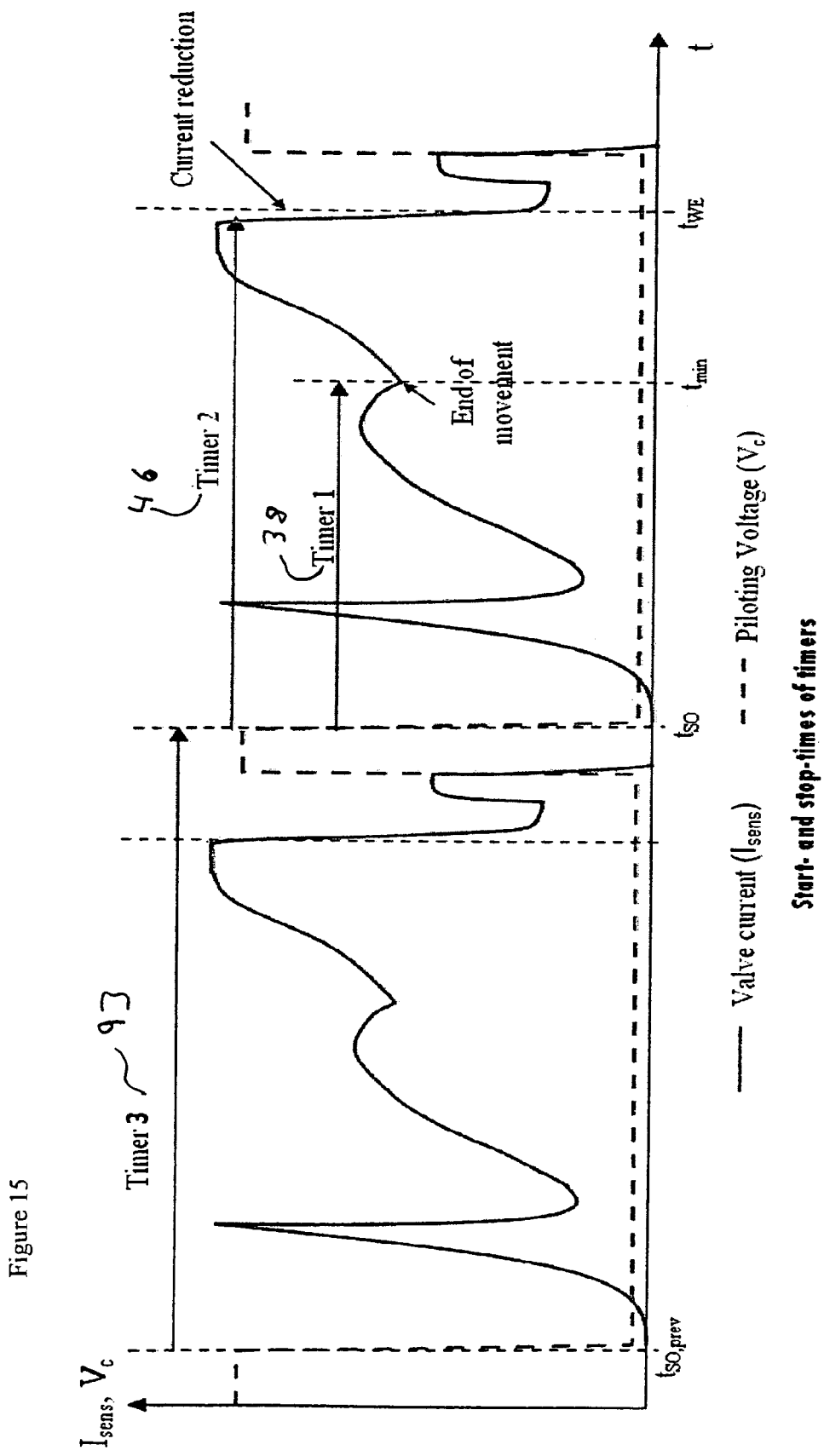
FIG. 15 is a graphical representation of the valve supply current and piloting voltage showing a first, second, and third timer.
Figure 20:
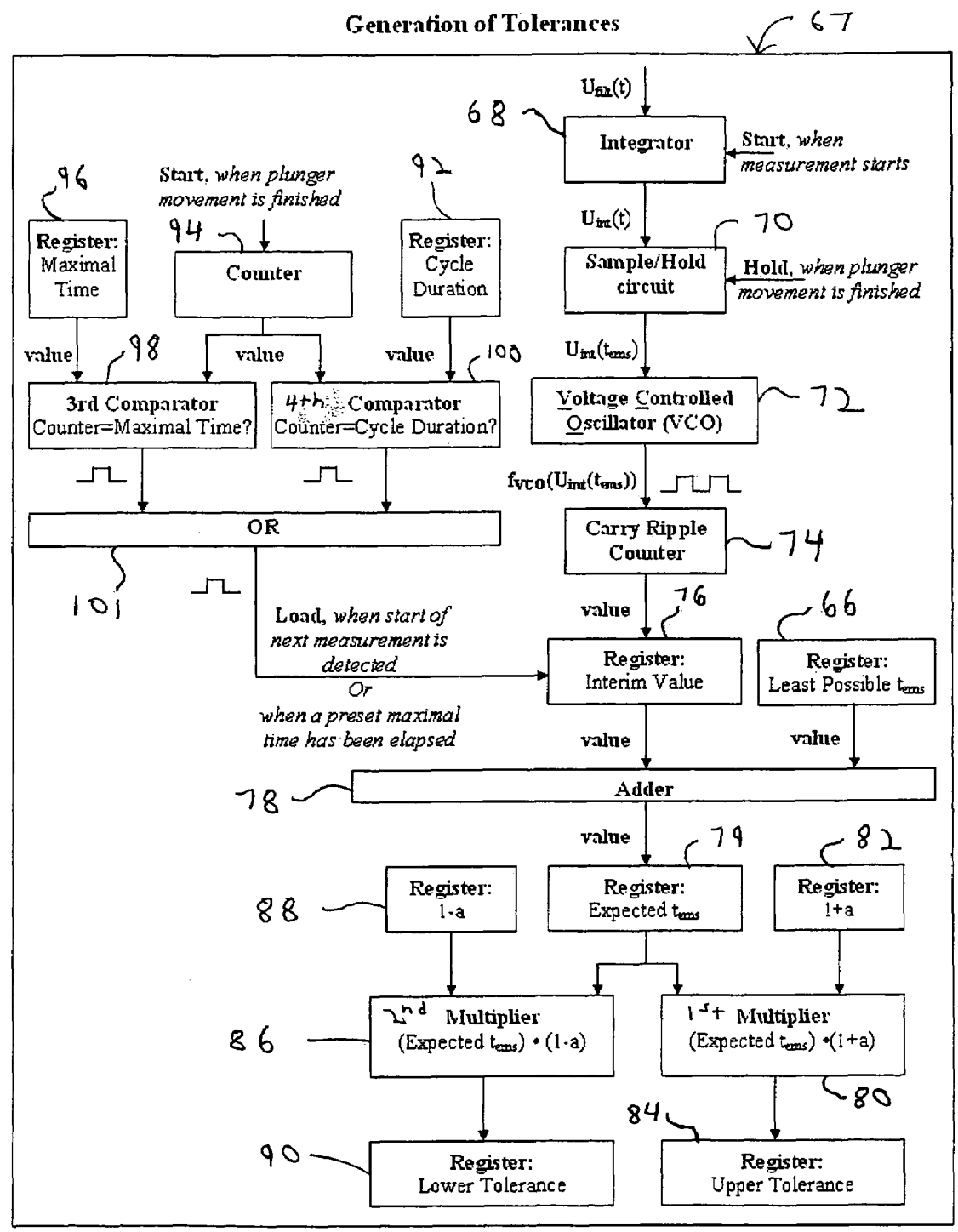
FIG. 20 is a block diagram of the generation of tolerances.
Figure 21:
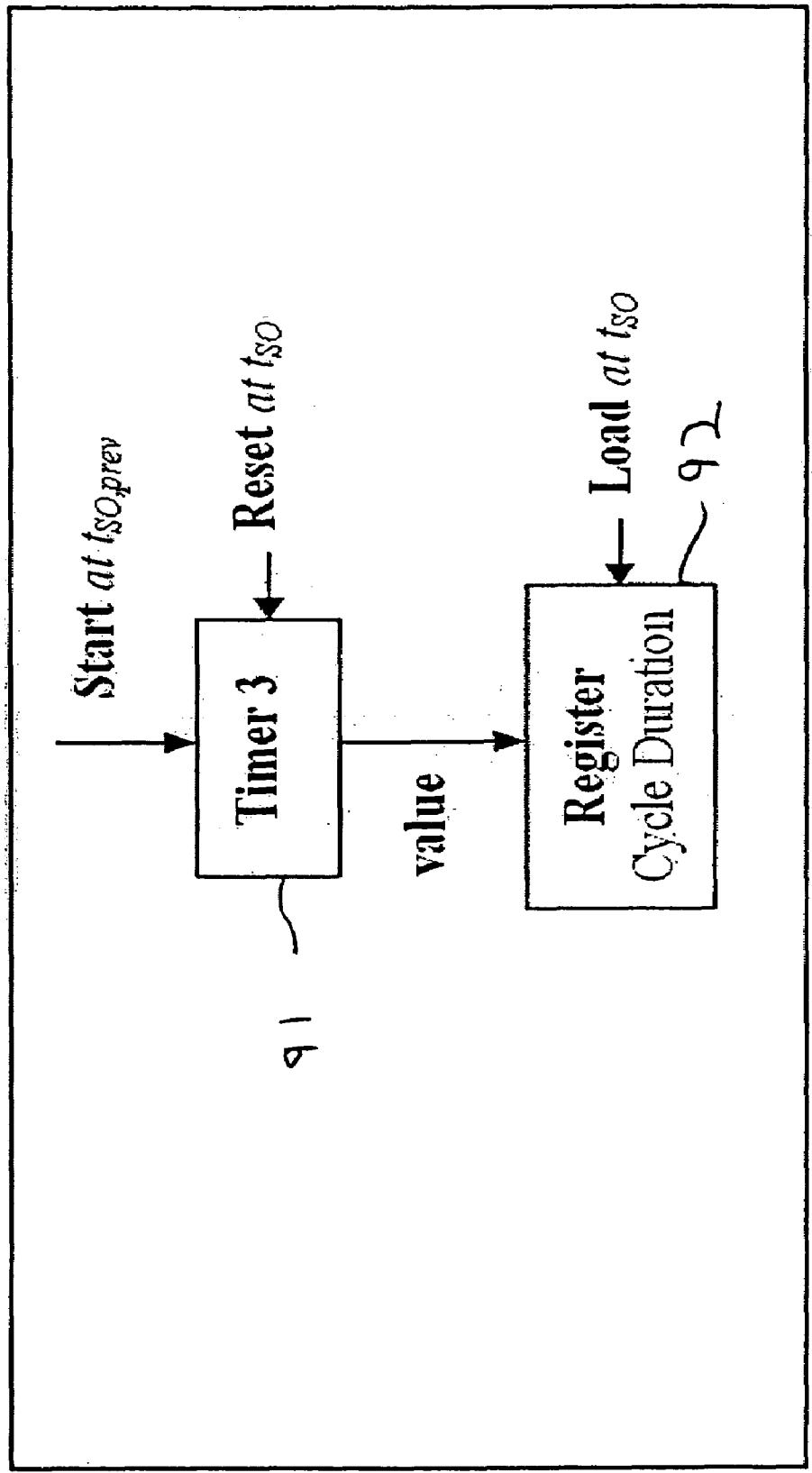
FIG. 21 is a block diagram of the duration of switching cycle.

With reference to FIGS. 14 and 15, the present invention detects the condition for the start of the measurement. As set forth above, the energizing of the valve is indicated by a negative slope of the output signal (U_sens) of the current sensor. This lets a Differentiator 1, 32, produce a high level voltage signal at its output (U_diff), which in turn is fed into a Schmitt-Trigger 1, 34. The Schmitt trigger 1, 34 produces a positive high slope output signal which starts the Integrator within the functional block "Generation of Tolerances", described below (FIG. 20), and Timers 1, 2 and 3 within the blocks "Detection of the Electro-Mechanical Switching Time," "Control of Detection of the Electro-Mechanical Switching Time," and "Duration of Switching Cycle" (FIGS. 16, 17 and 21).

"Detection of Electro-Mechanical Switching Time"

Figure 16:
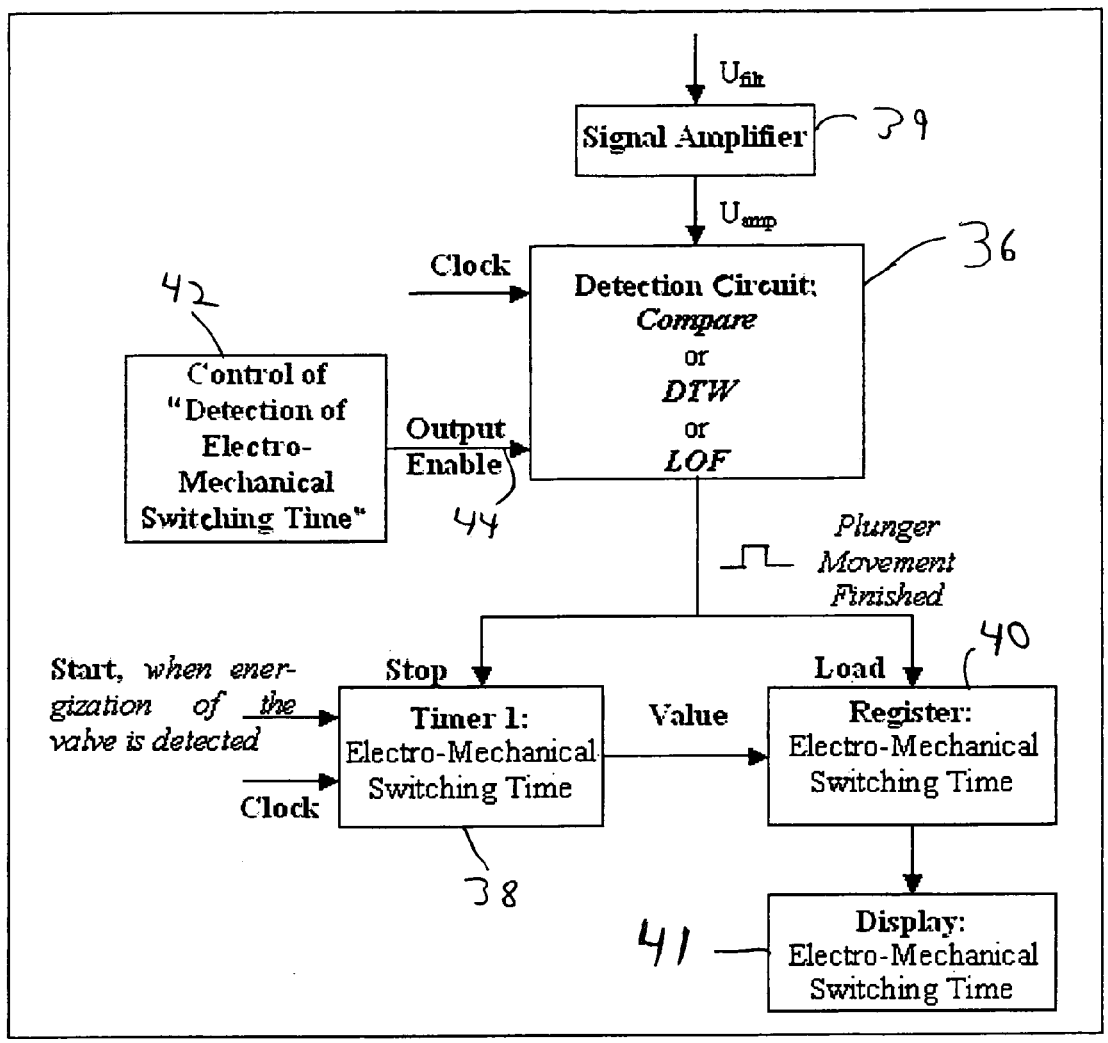
FIG. 16 is a block diagram of the detection of the electro-mechanical switch time.
Figure 17:
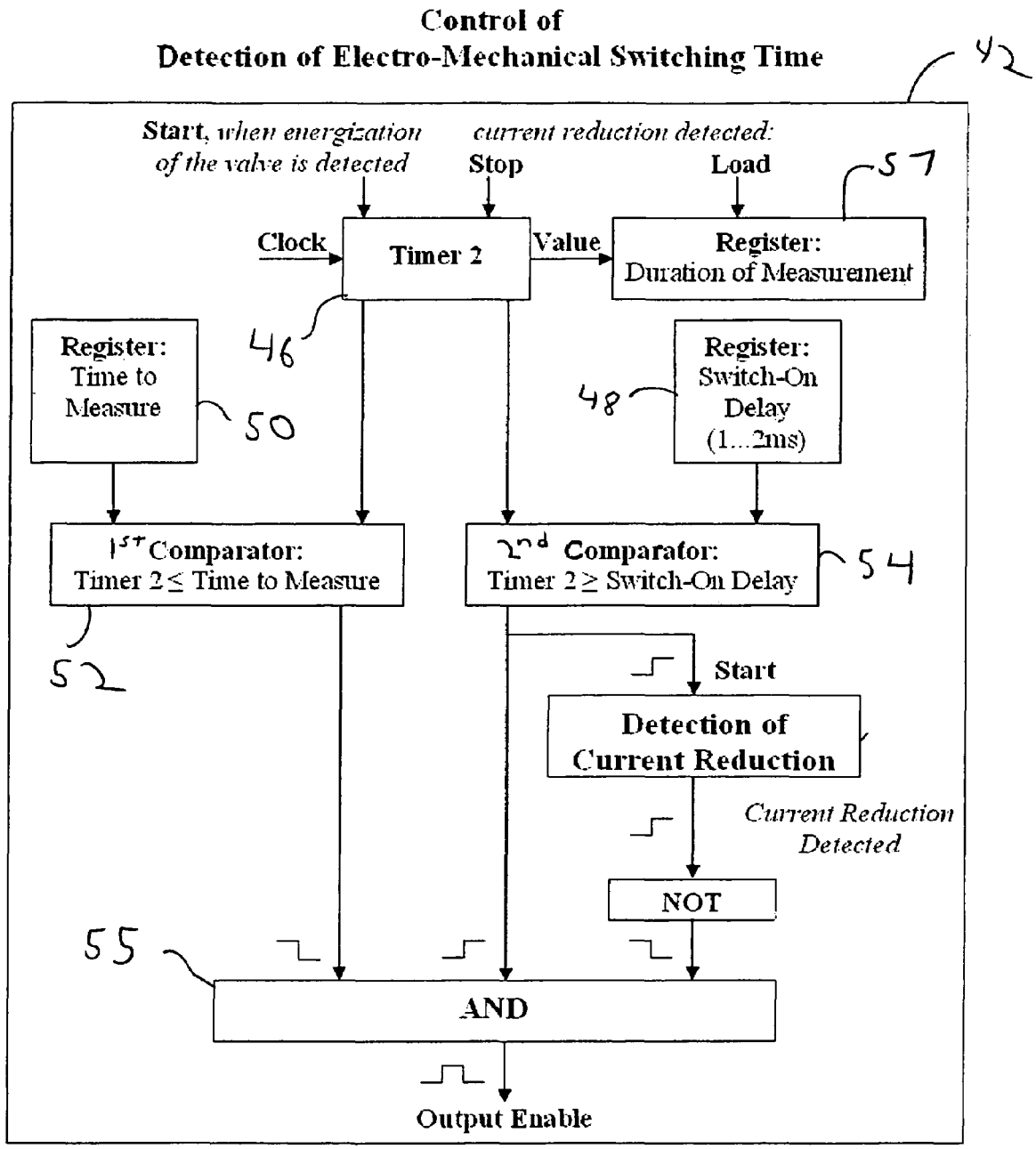
FIG. 17 is a block diagram of the control of the detection circuit of FIG. 16.

Referring to FIG. 16, the end of the movement of the plunger is detected and the electro-mechanical switching time is calculated through use of a Detection Circuit 36 and a Timer 1, 38. Timer 1, 38 is switched on by the valve energizing signal and switched off by the Detection Circuit 36. The signal acquired from the current sensing circuit 22 may be amplified by a Signal Amplifier 39 and fed into the Detection Circuit 36. The Detection Circuit determines when the plunger has completed its movement after the valve has received the switch-on signal. This may be achieved by applying one of the previously described detection algorithms (Compare, DTW, LOF) to the inputted signal. As soon as the end of the plunger movement is detected (this is indicated by a square wave signal), Timer 1, 38, stops and its output value is loaded into Register: Electro-Mechanical Switching Time 40. The acquired value for the electro-mechanical switching time may be indicated to a user via a display 41 for control and demonstration purposes when needed.

In the preferred embodiment, the detection circuit 36 is controlled such that the output of the detection circuit is only enabled when the plunger is expected to finish its movement, i.e., during the time window, $t_w$. Therefore, the detection circuit 36 is operably connected to a controller 42 which selectively enables and disables the output of the detection circuit 36 by way of an output/enable signal 44. The output/enable signal 44 is desirable since it will let drop all the parts of the current curve that are not required for the detection of the electro-mechanical switching time.

"Control of "Detection of Electro-Mechanical Switching Time"

Referring to FIG. 17, the control of the detection circuit is shown. Controller 42 enables the output of the detection circuit 36 only when certain conditions are met. Preferably, the output will be enabled after the switch-on delay has passed and before either a current reduction is detected or a predetermined Time to Measure time period expires.

The controller 42 preferably consists of a Timer 2, 46 and memory register 48 for storing the Switch-on Delay value. As set forth above with reference to FIG. 3, the beginning of the time window may be delayed in order to prevent the beginning and unstable part of the current signal from improperly influencing the evaluations.

The "Time to Measure" may be a predetermined time period that determines the end point for the time window. As described above, the end of the time window may be detected by sensing a current reduction. When a coil is over-excited to move the plunger, the current is relatively high. Once the plunger has fully moved the current can be lowered to a holding current. The lowering of the current to the holding current creates a steep slope of the current curve (FIG. 4) and is detectable. When such a current drop is detected, this sets the end of the time window. However, if there is no over-excitement of the valve and hence no significant current reduction, the end of the time window can be manually set to a desired time, which is stored in register 50. This Time to Measure value would depend on the type of valve and its switching characteristics. The use of a predetermined Time to Measure value permits the controller 42 to be used for valves that do not have a current reduction.

Figure 18:
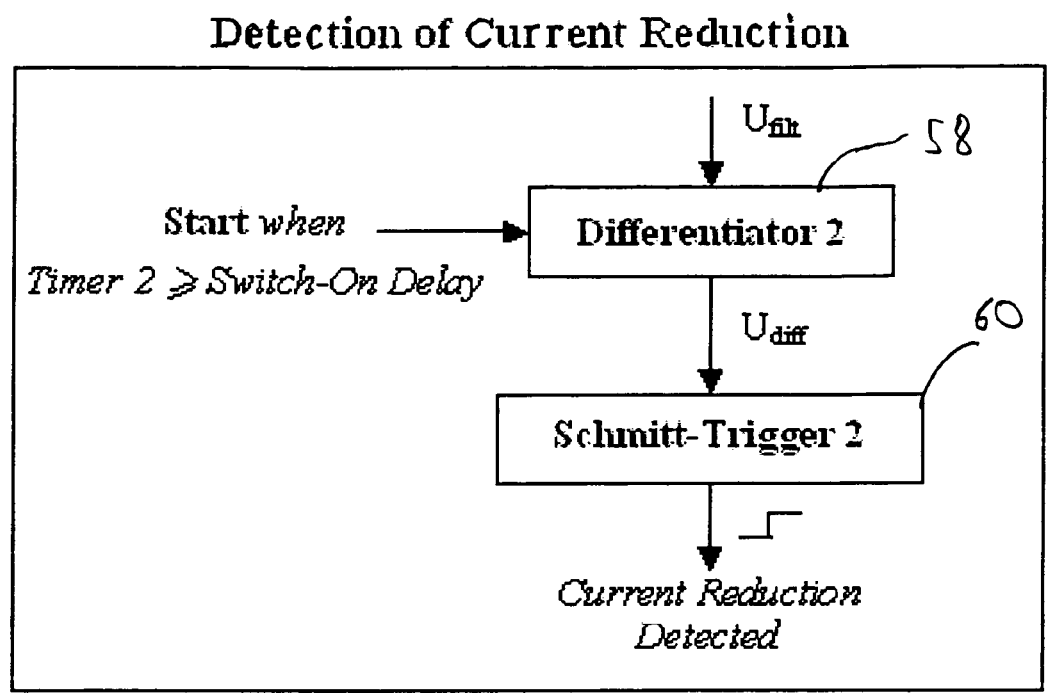
FIG. 18 is a block diagram of the detection of a current reduction.

The output of Timer 2 is compared via a first comparator 52 to the Time to Measure value. The Timer 2 output is also compared via a second comparator 54 to the Switch-on Delay value stored in register 48. The Current Reduction, as more fully described with respect to FIG. 18, is also sensed to determine if the current has been reduced. The output from the first 52 and second 54 comparators and the inverted output of the Detection of Current Reduction are fed into an And-Gate 55. If the time is less than the Time to Measure value, and greater than the Switch-on Delay value, and a reduction in current has not been detected, then the output of the Detection Circuit 36 is enabled. These conditions define the parameters of the time window referred to above, and enable the output of the Detection Circuit 36 only during the time window.

Accordingly, the Output/Enable will go high when the following conditions are met:

1. the value of "Timer 2" must be less than the manually preset value of "Time to Measure"

AND 2. the value of "Timer 2" must be greater than the value of "Switch-On Delay"

AND 3. the inverted value of "Detection of Current Reduction" must be high. This is the case only if no current reduction is detected.

The output/enable signal is disabled, or goes low, before the switch-on delay times out. In addition, as soon as a current reduction is detected by "Detection of Current Reduction" or as soon as "Timer 2" has a greater value than "Time to Measure", the "Output/Enable" goes low. During these time periods, the detection current does not output any signal. Therefore, the current curve is not used to determine the $t_{ems}$.

Timer 2, 46 starts as soon as it is detected that the valve is energized (see FIGS. 3 and 15). Timer 2 stops when current reduction is detected. The time value between these events is stored in a Duration of Measurement Register 57, which is used in valve failure detection.

"Detection of Current Reduction"

In a valve where the solenoid is over-excited, the time when the current is reduced determines the end of the time window as represented in FIGS. 4 and 5. The slope of the current curve is evaluated to detect a negative slope having a certain magnitude. When this slope value is determined, the current reduction part of the current curve has been detected.

With reference to FIG. 18, the filtered signal $U_{filt}$ is fed into a Differentiator 2, 58 which is started after a preset time delay in the Switch-on Delay register 48. Once the negative slope is detected by Differentiator 2, 58, the output of Schmitt-Trigger 2, 60 is set to a logical high indicating the detection of the current reduction.

"Valve Failure Detection"

Figure 19:
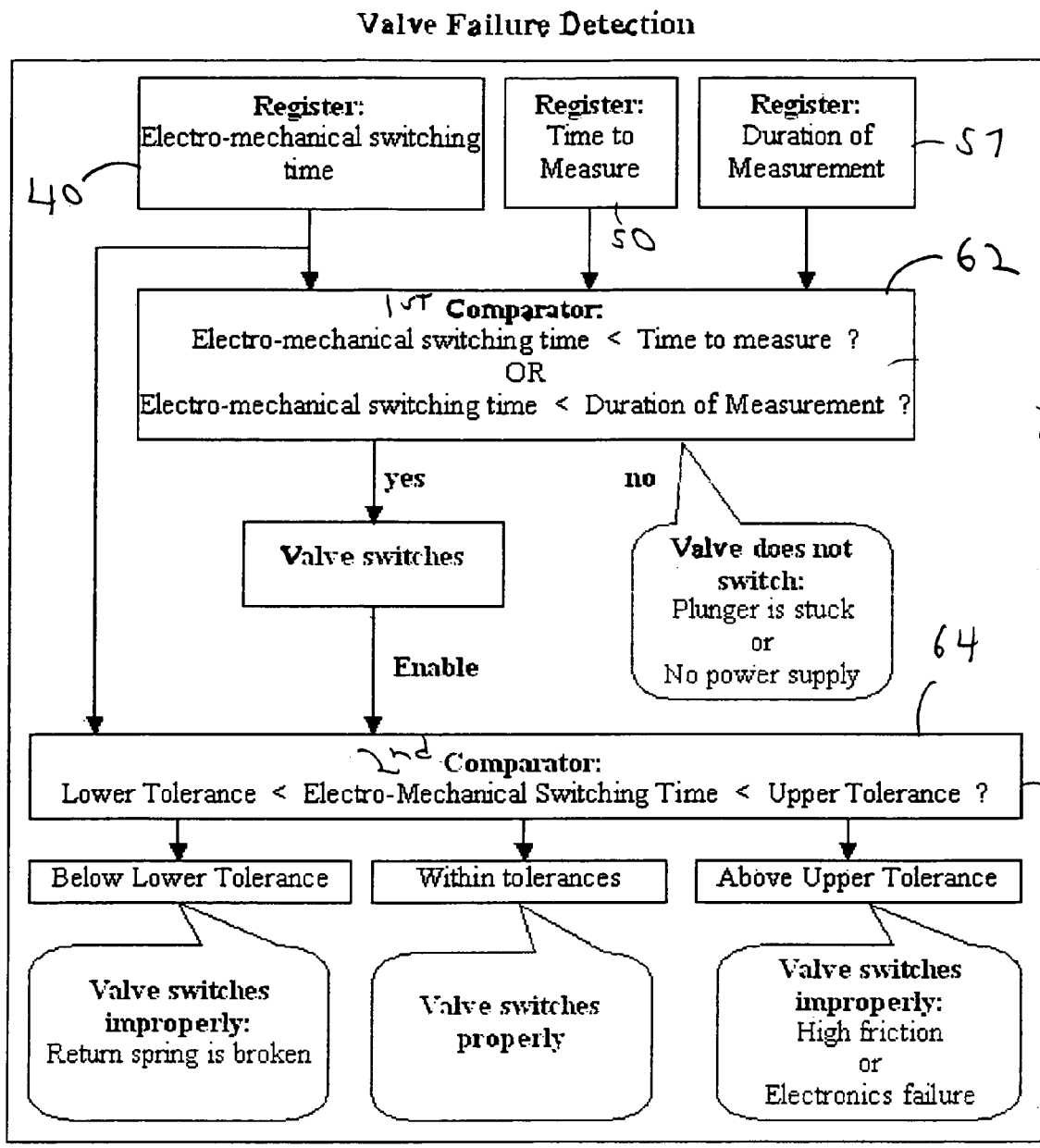
FIG. 19 is a block diagram of the valve failure detection feature of the present invention.

Referring to FIG. 19, determining whether the valve operates within specifications is preferably performed as follows. First, the electro-mechanical switching time, $t_{ems}$, stored in register 40 is compared via a first comparator 62 to the Time to Measure value stored in register 50 and the Duration of Measurement value stored in register 57 to determine if the switching time is less than these values. If not, then the valve plunger is either stuck or the coil of the valve is not being energized. An appropriate diagnostic message can then be generated.

If the switching time is less than the Time to Measure and Duration of Measurement values, the valve is switching, but still it must be determined whether or not the monitored valve is working within specifications. To achieve this, a range of acceptable operating parameters or tolerances may be created. A preferred manner of generating the tolerance range is set forth below with reference to FIG. 20. Lower and upper tolerance limits are determined and the electro-mechanical switching time is compared via a second comparator 64 with the lower tolerance and with the upper tolerance. As long as $t_{ems}$ is within the upper and lower tolerances, the valve is considered to be functioning properly. However, if $t_{ems}$ falls below the lower tolerance, then the return spring of the valve is likely broken since the spring does not offer any resistance against the movement of the plunger. If $t_{ems}$ is above the upper tolerance, then a failure in electronics is highly probable or else the plunger is facing higher friction than specified. Appropriate diagnostic messages may be generated to allow a user to know the status of the valve. Preventative maintenance may then be performed to repair or replace the defective valve.

"Generation of Tolerances"

As set forth above, the tolerances may be generated by a tolerance generator 67 in order to take into account variations in the voltage to the valve coil and the switching frequency. Referring to FIG. 20, in order to generate the tolerances a reference values an Expected $t_{ems}$ is created. This expected electro-mechanical switching time depends on present operation conditions of the valve, such as voltage to the coil and the switching frequency. Expected $t_{ems}$ may consist of two parts: a Least Possible $t_{ems}$ and an Interim Value. The Least Possible $t_{ems}$ is preferably an empirical value which has been obtained by measurement of the electro-mechanical switching time while the valves have been operated with highest possible switching frequency as well as the highest possible supply voltage. This parameter is constant, and it is representative for each valve type. This value may be stored in a memory register 66.

The Interim Value parameter is responsible for the dynamic creation of the tolerances. It is preferably created internally after each measurement cycle of $t_{ems}$ based on the integrated sensor signal, which takes into account the influence of the supply voltage, and on the switching frequency of the valve.

An Integrator 68 integrates the sensor signal $U_{filt}(t)$ from the start of measurement until the plunger finishes its movement. At the end of the integration, the output voltage $U_{int}(t_{ems})$ of the Integrator is held by Sample/Hold Circuit 70.

This voltage controls the frequency $f_{VCO}(U_{int}(t_{ems}))$ of the output signal of a Voltage Controlled Oscillator (VCO) 72. The relationship is as follows:

$$f_{VCO}=U_{int}(t_{ems})$$

The equation depends on the type of the VCO used in the circuit. It is preferred to use a VCO with a linear dependence of the frequency from the input voltage with an equation of the form:

$$f_{VCO}=c*U_{int}(t_{ems}),$$

wherein c is the VCO's own proportionality factor between the input voltage and the frequency of the output signal.

The binary output value of a Carry Ripple Counter 74 increments after each elapsed period of the input signal with the frequency $f_{VCO}(U_{int}(t_{ems}))$. The value increments until it is loaded in an Interim Value Register 76 at a particular time as set forth below.

Referring additionally to FIG. 21, a measure of the duration of the switching cycle is also employed to generate the "Interim Value". Doing so takes into account the influence of the switching frequency on the electro-mechanical switching time to permit the creation of tolerance limits. For this purpose, Timer 3, 91, measures the duration of the previous switching cycle, that is, the time from the switch on signal from the previous cycle to the switch on signal of the present cycle. Time 3 is therefore started at the time $t_{SO,prev}$ (start of the previous switching cycle ) (FIG. 15). The value of Timer 3 is loaded at the time $t_{SO}$ (start of the measurement of the electro-mechanical switching time) into the register "Cycle Duration" 92 while Timer 3 is reset and restarted at the same time to provide a Cycle Duration for the next cycle and measurement. The value of a Counter 94, which is started when the end of plunger movement is detected, is compared to the value of a register "Maximal Time" 96 in a $3^{rd}$ Comparator 98 and to the value of the register "Cycle Duration" 92 in a $4^{th}$ Comparator 100. The output of the $3^{rd}$ and $4^{th}$ Comparators are connected to an OR-gate 101. The maximal time is the largest electro-mechanical switching time, which can occur under worst case conditions such as lower tolerance for operating voltage (Vcc), smallest switching frequency, and smallest duty cycle. The maximal switching time is measured for a value sample of a particular valve type under worst case conditions. The maximal switching time may be preset into the Maximal Time register 96. As soon as one of the values is equal to the value of counter 94, the value of Carry Ripple Counter is loaded into Interim Value register 76. For example, if the Cycle duration is shorter than the Maximal value, when the counter 94 reaches the cycle duration value, then the value of the Carry Ripple Counter will be loaded into the Interim Value register 76.

The so-acquired Interim Value is added to Least Possible $t_{ems}$ by an adder 78 to obtain the expected electro-mechanical switching time, which is stored in register 79.

The sample/hold circuit 70 holds the value at the same time when the counter 94 begins counting. Therefore, Carry Ripple Counter 74 will keep counting until it receives a load signal. Since the load signal is dependant on the cycle duration, or maximal time, the longer the cycle duration the greater the Counter 74 value and the greater the interim value. Since the interim value is used to determine the Expected electro-mechanical switching time, $t_{ems}$, the greater the cycle duration the greater the Expected $t_{ems}$. Therefore, the switching frequency is taken into account in determining the tolerances.

At very low switching frequencies, the electro-mechanical switching time is not affected by this parameter and a cyclic measurement in a way described above cannot be performed. In this case, the maximal time between the start of the Carry Ripple Counter 74 and the loading of its value into the Interim Value register 76 can be defined. This way, the highest possible value of the Interim Value is created. The binary value of the Carry Ripple Counter 74 is then loaded into the Interim Value register 76 and the Counter 74 itself is reset at the same time. This immediately starts the next cycle of generating the Interim Value.

The tolerances are created by multiplying via first multiplier 80 which obtained the expected $t_{ems}$ by the preset percentual tolerances "1+a" stored in register 82, to calculate the Upper Tolerance which is stored in register 84. By way of second multiplier 86, the Expected $t_{ems}$ value is multiplied by "1−a", stored in register 88, to calculate the Lower Tolerance, which is then stored in register 90. The parameter "a" is an empirically identified value for a particular type series of solenoid valves. The Upper and Lower Tolerances are used in the valve failure detection as described above with reference to FIG. 19.

It is within the contemplation of the present invention that alternative methods of determining the tolerances could be employed.

The functional blocks and various steps to carry out the invention may be performed by a discrete controller having suitable software and hardware.

It is within the contemplation of the present invention that a plurality of valves may be monitored in accordance with the present invention. Each valve would be connected to a sensing circuit and the current to each valve would be analyzed as described above.

Although the illustrative embodiments of the present invention have been described herein with reference to the accompanying drawings, it is to be understood that the invention is not limited to those precise embodiments, and that various other changes and modifications may be effected therein by one skilled in the art without departing from the scope or spirit of the invention.

What is claimed is:

1. A method of determining a functional status of an electro-mechanical valve having a solenoid and plunger comprising the steps of:
   determining an electro-mechanical switching time, $(t_{ems})$, of a valve based on an electrical characteristic responsive to the solenoid;
   determining the $(t_{ems})$ includes determining a beginning and an end of a time window, and wherein determining the beginning of the time window includes the steps of:
   evaluating the current supplied to the solenoid over time;
   evaluating a valve switching pilot voltage $(V_c)$ over time;
   determining when a slope of the $(V_c)$ reaches a predetermined negative value and assigning that time as a switch on time; and
   adding a predetermined time value to the switch on time to determine the beginning of the time window;
   comparing the $(t_{ems})$ to a tolerance value; and
   generating a valve status signal dependant on a result of the comparison.

2. The method as defined in claim 1, wherein the $(t_{ems})$ corresponds to movement of the plunger from when the solenoid is energized to when the plunger reaches an end position.

3. The method of claim 1, wherein determining the end of the time window includes the steps of:

evaluating the current supplied to the solenoid over time;
determining when a slope of the current is less than a predetermined minimum value; and
assigning the end of the time window when the slope of the current equals the predetermined minimum value.

4. The method of claim 1, wherein the step of determining the ($t_{ems}$) further includes the step of evaluating the current of the solenoid during the time window to determine an end of plunger movement.

5. The method of claim 4, wherein the step of evaluating the current includes determining change in current over time.

6. The method of claim 4, further comprising the steps of:
comparing successive values of the solenoid current;
determining when the solenoid current changes from increasing to decreasing;
determining when the solenoid current changes from decreasing to increasing; and
assigning the time when the solenoid current changes from decreasing to increasing as the end of the plunger movement.

7. The method of claim 6, wherein the step of determining the solenoid current changes includes sampling a slope of a curve corresponding to the solenoid current at a plurality of points in time within the time window.

8. The method of claim 7, further including the step of filtering a signal which corresponds to the current which is sampled to negate the effects of noise.

9. The method of claim 4, wherein determining the end of the plunger movement further includes the steps of:
evaluating the slope of a curve corresponding to the current staffing at the beginning of the time window;
determining when the slope assumes a negative value;
determining when the slope then assumes a positive value; and
assigning the end of plunger movement to be when the slope assumes the positive value.

10. The method of claim 9, including the steps of determining a time when the valve is energized and determining the ($t_{ems}$) by calculating the difference between the time of the end of the plunger movement and the time when the valve is energized.

11. The method of claim 4, wherein determining the end of the plunger movement includes the steps of:
sampling the solenoid current at a plurality of successive points over time, comparing the value of the current at each sample point to the preceding sample point to create an output value;
determining when the output value changes from a positive value to a negative value; and
assigning the end of the plunger movement when the output value changes from a negative value to a positive value.

12. The method of claim 4, wherein determining the end of the plunger movement includes the steps of:
sampling the solenoid current at a plurality of successive points over time;
comparing the value of the current at each sample point to the preceding sample point to create an output value for each sample point;
evaluating a plurality of sets of predetermined number of output values to determine if the output values are predominantly positive or negative;
when the output values in a set are predominantly positive assigning a positive set value to that set, and if the output values in the set are predominantly negative, assigning a negative set value to that set; and
determining when the set values change from a positive set value to a negative set value, assigning the end of the plunger movement to when the set value changes from a negative value to a positive value.

13. The method of claim 1 further comprising the step of starting a first timer when the valve is energized and combining an output from the first timer with the output of a detection circuit which evaluates the electrical characteristic to determine the electro-mechanical switching time.

14. The method of claim 1, wherein a detection circuit determines the electro-mechanical switching time, and further comprising the step of providing a controller operably connected to the detection circuit and the controller selectively enabling and disabling an output of the detection circuit.

15. The method of claim 1, wherein the tolerance value includes an upper and lower tolerance and wherein determining the tolerances includes the steps of determining a least possible ($t_{ems}$) and an interim ($t_{ems}$), wherein the least possible ($t_{ems}$) is a predetermined constant value, and the interim value is determined after each valve cycle.

16. The method of claim 15, wherein the interim value is determined by integrating a signal voltage over time to determine an output voltage value and storing that value, and using the output voltage value to control a voltage control oscillator.

17. A method of monitoring the functional status of an electro-mechanical valve having a solenoid coil and plunger comprising the steps of:
energizing the solenoid coil to initiate movement of the solenoid plunger from a first position to a second position;
acquiring a signal relating to an electrical characteristic responsive to the solenoid;
performing an algorithm on the signal to determine when the plunger reaches the second position;
determining a time value based on the plunger movement between the first and second position including the step of staffing a timer upon energizing the solenoid and stopping the timer when the plunger reaches the second position;
comparing the time value to a lower and an upper tolerance value; and
indicating a functional status of the valve based on the comparison.

18. The method of claim 17, wherein the electrical characteristic is current supplied to the solenoid coil.

19. The method of claim 18, further including the step of providing a voltage divider to generate a voltage signal corresponding to the current supplied to the solenoid.

20. The method of claim 18, performing the algorithm on the signal includes the step of evaluating the change in the current over time.

21. The method of claim 20, further including the step of determining that the plunger has reached the second position when the change in the current goes from decreasing to increasing.

22. The method of claim 21, further including the step of defining a time window during which the signal is evaluated to determine when the plunger reaches the second position.

23. The method of claim 22, wherein the time window begins a predetermined amount of time after the energizing of the solenoid coil.

24. A method of determining a functional status of an electromagnetic valve having a solenoid and plunger comprising the steps of:
- determining a time value for the plunger to move between an initial position and a final position based on a first electrical characteristic responsive to the solenoid;
- comparing the time value to a tolerance range including an upper and lower limit;
- sensing a second electrical characteristic responsive to the solenoid and determining the tolerance range responsive to the second electrical characteristic; and
- generating a valve status signal indicating a defective valve if the time value falls outside of the tolerance range.

* * * * *

UNITED STATES PATENT AND TRADEMARK OFFICE
CERTIFICATE OF CORRECTION

| | | |
|---|---|---|
| PATENT NO. | : 7,405,917 B2 | Page 1 of 1 |
| APPLICATION NO. | : 11/455270 | |
| DATED | : July 29, 2008 | |
| INVENTOR(S) | : Ahrens et al. | |

It is certified that error appears in the above-identified patent and that said Letters Patent is hereby corrected as shown below:

IN THE CLAIMS:

Claim 9, Column 15 line 31, now reads "staffing at the beginning" should read --starting at the beginning--

Claim 17, Column 16 line 41, now reads "of staffing a timer" should read --of starting a timer--

Signed and Sealed this

Ninth Day of December, 2008

JON W. DUDAS
*Director of the United States Patent and Trademark Office*